(12) United States Patent
Kim

(10) Patent No.: US 10,691,530 B2
(45) Date of Patent: Jun. 23, 2020

(54) APPARATUSES AND METHODS FOR CORRECTING ERRORS AND MEMORY CONTROLLERS INCLUDING THE APPARATUSES FOR CORRECTING ERRORS

(71) Applicant: SK hynix Inc., Icheon-si Gyeonggi-do (KR)

(72) Inventor: Soojin Kim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 366 days.

(21) Appl. No.: 15/653,792

(22) Filed: Jul. 19, 2017

(65) Prior Publication Data

US 2018/0196712 A1    Jul. 12, 2018

(30) Foreign Application Priority Data

Jan. 11, 2017   (KR) .................. 10-2017-0004430

(51) Int. Cl.
| | |
|---|---|
| *G06F 11/10* | (2006.01) |
| *H04K 1/04* | (2006.01) |
| *G06F 12/02* | (2006.01) |
| *G11C 29/52* | (2006.01) |
| *H03M 13/35* | (2006.01) |
| *H03M 13/13* | (2006.01) |

(52) U.S. Cl.
CPC ...... *G06F 11/1044* (2013.01); *G06F 11/1012* (2013.01); *G06F 11/1048* (2013.01); *G06F 11/1068* (2013.01); *G06F 12/0238* (2013.01); *G11C 29/52* (2013.01); *H03M 13/353* (2013.01); *H04K 1/04* (2013.01); *H03M 13/13* (2013.01)

(58) Field of Classification Search
CPC ............ G06F 11/1044; G06F 11/1068; G06F 12/0238; G06F 11/1048; G06F 11/1012; H03M 13/353; H03M 13/13; G11C 29/52; H04K 1/04
USPC ...................................................... 714/768
See application file for complete search history.

(56) References Cited

U.S. PATENT DOCUMENTS

| | | | | |
|---|---|---|---|---|
| 8,261,159 | B1 * | 9/2012 | Sommer | G06F 11/1048 713/193 |
| 2007/0043999 | A1 * | 2/2007 | Ariyama | G11B 20/18 714/758 |
| 2009/0323942 | A1 * | 12/2009 | Sharon | G11C 7/1006 380/44 |
| 2010/0122143 | A1 * | 5/2010 | Lee | H03M 13/1117 714/752 |
| 2011/0093759 | A1 * | 4/2011 | Song | H04L 1/0042 714/756 |
| 2013/0343131 | A1 * | 12/2013 | Wu | G11C 16/26 365/185.24 |

(Continued)

FOREIGN PATENT DOCUMENTS

KR    1020130096673 A    8/2013

*Primary Examiner* — Albert Decady
*Assistant Examiner* — Enam Ahmed
(74) *Attorney, Agent, or Firm* — William Park & Associates Ltd.

(57) ABSTRACT

An error correction apparatus may be provided. The error correction apparatus may be configured to perform a scrambling operation before an error correction code (ECC) operation is performed.

13 Claims, 31 Drawing Sheets

(56) References Cited

U.S. PATENT DOCUMENTS

| | | | |
|---|---|---|---|
| 2014/0229131 A1* | 8/2014 | Cohen | G11C 16/3427 702/64 |
| 2014/0240346 A1* | 8/2014 | Kawaguchi | G09G 5/377 345/629 |
| 2015/0256197 A1* | 9/2015 | Kim | G06F 11/1012 714/768 |

* cited by examiner

FIG.22

| BIT POSITIONS | FIRST BIT (D<0>) | SECOND BIT (D<1>) | THIRD BIT (D<2>) | FOURTH BIT (D<3>) | FIFTH BIT (D<4>) | SIXTH BIT (D<5>) | SEVENTH BIT (D<6>) | EIGHTH BIT (D<7>) |
|---|---|---|---|---|---|---|---|---|
| ARBITRARY VARIABLES | A00 | B00 | C00 | D00 | E00 | F00 | G00 | H00 |
| EXAMPLE | 1 | 0 | 0 | 0 | 0 | 0 | 0 | 0 |

FIG.23

|  | initial state | |
|---|---|---|
| 1st XOR OUTPUT | | |
| STORAGE ELEMENTS OF LFSR | S1 | 0 |
| | S2 | 0 |
| | S3 | 0 |
| | S4 | 0 |
| | S5 | 0 |

FIG.24

1st iteration step : D<0>=A00

| 1st XOR OUTPUT(X00) | | <S2>⊕<S5>=0 |
|---|---|---|
| STORAGE ELEMENTS OF LFSR | S1 | X00⊕<S1>=0⊕A00=A00 |
| | S2 | 0 |
| | S3 | 0 |
| | S4 | 0 |
| | S5 | 0 |

FIG.25

2nd iteration step : D<1>=B00

| 1st XOR OUTPUT(X00) | | <S2>⊕<S5>=0 |
|---|---|---|
| STORAGE ELEMENTS OF LFSR | S1 | X00⊕<S1>=0⊕B00=B00 |
| | S2 | A00 |
| | S3 | 0 |
| | S4 | 0 |
| | S5 | 0 |

FIG.26

3rd iteration step : D<2>=C00

| 1st XOR OUTPUT(X00) | | <S2>⊕<S5>=A00 |
|---|---|---|
| STORAGE ELEMENTS OF LFSR | S1 | X00⊕<S1>=A00⊕C00 |
| | S2 | B00 |
| | S3 | A00 |
| | S4 | 0 |
| | S5 | 0 |

FIG.27

4th iteration step : D<3>=D00

| 1st XOR OUTPUT(X00) | | <S2>⊕<S5>=B00 |
|---|---|---|
| STORAGE ELEMENTS OF LFSR | S1 | X00⊕<S1>=B00⊕D00 |
| | S2 | A00⊕C00 |
| | S3 | B00 |
| | S4 | A00 |
| | S5 | 0 |

FIG.28

5th iteration step : D<4>=E00

| | 1st XOR OUTPUT(X00) | <S2>⊕<S5>=A00⊕C00 |
|---|---|---|
| STORAGE ELEMENTS OF LFSR | S1 | X00⊕<S1>=A00⊕C00⊕E00 |
| | S2 | B00⊕D00 |
| | S3 | A00⊕C00 |
| | S4 | B00 |
| | S5 | A00 |

FIG.29

6th iteration step : D<5>=F00

| 1st XOR OUTPUT(X00) | | <S2>⊕<S5>=A00⊕B00⊕D00 |
|---|---|---|
| STORAGE ELEMENTS OF LFSR | S1 | X00⊕<S1>=A00⊕B00⊕D00⊕F00 |
| | S2 | A00⊕C00⊕E00 |
| | S3 | B00⊕D00 |
| | S4 | A00⊕C00 |
| | S5 | B00 |

FIG.30

7th iteration step : D<6>=G00

| 1st XOR OUTPUT(X00) | | <S2>⊕<S5>=A00⊕B00⊕C00⊕E00 |
|---|---|---|
| STORAGE ELEMENTS OF LFSR | S1 | X00⊕<S1>=A00⊕B00⊕C00⊕E00⊕G00 |
| | S2 | A00⊕B00⊕D00⊕F00 |
| | S3 | A00⊕C00⊕E00 |
| | S4 | B00⊕D00 |
| | S5 | A00⊕C00 |

FIG.31

8th iteration step : D<7>=H00

| 1st XOR OUTPUT(X00) | | <S2>⊕<S5>=B00⊕C00⊕D00⊕F00 |
|---|---|---|
| STORAGE ELEMENTS OF LFSR | S1 | X00⊕<S1>=B00⊕C00⊕D00⊕F00⊕H00 |
| | S2 | A00⊕B00⊕C00⊕E00⊕G00 |
| | S3 | A00⊕B00⊕D00⊕F00 |
| | S4 | A00⊕C00⊕E00 |
| | S5 | B00⊕D00 |

APPARATUSES AND METHODS FOR CORRECTING ERRORS AND MEMORY CONTROLLERS INCLUDING THE APPARATUSES FOR CORRECTING ERRORS

CROSS-REFERENCE TO RELATED APPLICATION

The present application claims priority under 35 U.S.C 119(a) to Korean Application No. 10-2017-0004430, filed on Jan. 11, 2017, which is herein incorporated by references in its entirety.

BACKGROUND

1. Technical Field

Various embodiments of the present disclosure may generally relate to error correction apparatuses of semiconductor devices and, more particularly, to apparatuses of correcting errors, methods of correcting errors, and memory controllers including the apparatuses of correcting errors.

2. Related Art

Nonvolatile memory devices retain their stored data even when its power supplies are interrupted. Data storage units including the nonvolatile memory devices are widely used in portable systems such as smart phones, digital cameras or computers. The nonvolatile memory devices, particularly, NAND-type flash memory devices have been developed using multi-level cell (MLC) techniques and advanced process techniques to increase the integration density of the NAND-type flash memory devices. The MLC techniques have been proposed to increase the number of bits which are capable of storing data in a single cell, and the advanced process techniques have been proposed to reduce a minimum feature size of patterns constituting memory cells of semiconductor devices. Recently, three-dimensional and vertical cell structures have been developed to overcome the limitation of planar-type memory cell array structures in which memory cells are two dimensionally arrayed and to more efficiently increase the integration density of the NAND-type flash memory devices.

The process techniques for forming fine patterns and the MLC techniques for increasing the number of bits in a limited area may lead to degradation of the reliability of the NAND-type flash memory devices. This is because cell-to-cell interference occurs if a pattern size is reduced and data errors easily occur if multi-bits are realized in a single cell using the MLC techniques. Accordingly, an error correction code (ECC) scheme has been used to guarantee the reliability of the semiconductor devices which are fabricated using the advanced process techniques and the MLC techniques.

In the case of the nonvolatile memory devices such as phase change random access memory (PCRAM) devices, magnetoresistive RAM (MRAM) devices, nano floating gate memory (NFGM) devices, resistive RAM (RRAM) devices or polymer RAM devices, a read margin for recognizing a difference between a datum "0" and a datum "1" may be relatively narrow due to the nature of cells thereof. Thus, the nonvolatile memory devices including the PCRAM devices, the MRAM device, the NFGM devices, the RRAM devices and the polymer RAM devices may exhibit a relatively high error rate as compared with the NAND-type flash memory devices even though a single level cell (SLC) structure is employed therein. Accordingly, it call for a greater necessity to employ the ECC scheme in the nonvolatile memory devices including the PCRAM devices, the MRAM device, the NFGM devices, the RRAM devices and the polymer RAM devices.

SUMMARY

According to an embodiment, an error correction apparatus may include a scrambler, an error correction code (ECC) encoder, an ECC decoder and a descrambler. The scrambler may be configured to randomize original data to generate scrambled data. The ECC encoder may be configured to perform an ECC encoding operation of the scrambled data to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The descrambler may be configured to descramble the decoded data to generate descrambled data that are restored to have the same bit array sequence as the original data.

According to an embodiment, an error correction apparatus may include a scrambler, a randomness checker, a scrambling selector, an error correction code (ECC) encoder, an ECC decoder, a descrambling selector and a descrambler. The scrambler may be configured to randomize original data to generate scrambled data. The randomness checker may be configured to compare randomness of the original data with randomness of the scrambled data to generate a first control selection signal. The scrambling selector may be configured to select and output the original data or the scrambled data based on the first control selection signal. The error correction code (ECC) encoder may be configured to perform an ECC encoding operation of output data of the scrambling selector to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The descrambling selector may be configured to output the decoded data to a first route or a second route based on a second control selection signal. The descrambler may be configured to descramble the decoded data to generate descrambled data that are restored to have the same bit array sequence as the original data, if the descrambling selector outputs the decoded data to the first route.

According to an embodiment, an error correction apparatus may include a first scrambler, a second scrambler, an error correction code (ECC) encoder, an ECC decoder, a first descrambler and a second descrambler. The first scrambler may firstly randomize original data to generate first scrambled data. The second scrambler may secondly randomize the first scrambled data to generate second scrambled data. The error correction code (ECC) encoder may be configured to perform an ECC encoding operation of the second scrambled data to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The first descrambler may be configured to descramble the decoded data having a bit array sequence randomized by the second scrambler to generate first descrambled data that are restored to have the same bit array sequence as the first scrambled data. The second descrambler may be configured to descramble the first descrambled data having a bit array sequence randomized by the first scrambler to generate second descrambled data that are restored to have the same bit array sequence as the original data.

According to an embodiment, an error correction apparatus may include a first scrambler, a second scrambler, a randomness checker, a scrambling selector, an error correction code (ECC) encoder, an ECC decoder, a descrambling selector, a first descrambler and a second descrambler. The first scrambler may firstly randomize original data to generate first scrambled data. The second scrambler may secondly randomize the first scrambled data to generate second scrambled data. The randomness checker may be configured to analyze randomness of the original data, the first scrambled data and the second scrambled data to generate a first control selection signal. The scrambling selector may be configured to select and output the original data, the first scrambled data or the second scrambled data based on the first control selection signal. The error correction code (ECC) encoder may be configured to perform an ECC encoding operation of output data of the scrambling selector to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The descrambling selector may be configured to output the decoded data to one route selected from a first route, a second route and a third route based on a second control selection signal. The first descrambler may be configured to descramble the decoded data to generate and output first descrambled data that are restored to have the same bit array sequence as the first scrambled data, if the descrambling selector outputs the decoded data to the first route. The second descrambler may be configured to descramble the first descrambled data or the decoded data to generate second descrambled data that are restored to have the same bit array sequence as the original data, if the first descrambler outputs the first descrambled data or the descrambling selector outputs the decoded data to the second route.

According to an embodiment, there may be provided a memory controller coupled with a host and a memory device to control the memory device based on a command outputted from the host a memory controller. The memory controller may include an error correction apparatus. The error correction apparatus may include a scrambler, an error correction code (ECC) encoder, an ECC decoder and a descrambler. The scrambler may be configured to randomize original data to generate scrambled data. The ECC encoder may be configured to perform an ECC encoding operation of the scrambled data to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The descrambler may be configured to descramble the decoded data to generate descrambled data that are restored to have the same bit array sequence as the original data.

According to an embodiment, there may be provided a memory controller coupled between a host and a memory device to control the memory device based on a command outputted from the host a memory controller. The memory controller may include an error correction apparatus. The error correction apparatus may include a scrambler, a randomness checker, a scrambling selector, an error correction code (ECC) encoder, an ECC decoder, a descrambling selector and a descrambler. The scrambler may be configured to randomize original data to generate scrambled data. The randomness checker may be configured to compare randomness of the original data with randomness of the scrambled data to generate a first control selection signal. The scrambling selector may be configured to select and output the original data or the scrambled data based on the first control selection signal. The error correction code (ECC) encoder may be configured to perform an ECC encoding operation of output data of the scrambling selector to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The descrambling selector may be configured to output the decoded data to a first route or a second route based on a second control selection signal. The descrambler may be configured to descramble the decoded data to generate descrambled data that are restored to have the same bit array sequence as the original data, if the descrambling selector outputs the decoded data to the first route.

According to an embodiment, there may be provided a memory controller coupled with a host and a memory device to control the memory device based on a command outputted from the host a memory controller. The memory controller may include an error correction apparatus. The error correction apparatus may include a first scrambler, a second scrambler, an error correction code (ECC) encoder, an ECC decoder, a first descrambler and a second descrambler. The first scrambler may firstly randomize original data to generate first scrambled data. The second scrambler may secondly randomize the first scrambled data to generate second scrambled data. The error correction code (ECC) encoder performs an ECC encoding operation of the second scrambled data to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The first descrambler may be configured to descramble the decoded data having a bit array sequence randomized by the second scrambler to generate first descrambled data that are restored to have the same bit array sequence as the first scrambled data. The second descrambler may be configured to descramble the first descrambled data having a bit array sequence randomized by the first scrambler to generate second descrambled data that are restored to have the same bit array sequence as the original data.

According to an embodiment, there may be provided a memory controller coupled between a host and a memory device to control the memory device based on a command outputted from the host a memory controller. The memory controller may include an error correction apparatus. The error correction apparatus may include a first scrambler, a second scrambler, a randomness checker, a scrambling selector, an error correction code (ECC) encoder, an ECC decoder, a descrambling selector, a first descrambler and a second descrambler. The first scrambler may firstly randomize original data to generate first scrambled data. The second scrambler may secondly randomize the first scrambled data to generate second scrambled data. The randomness checker may be configured to analyze randomness of the original data, the first scrambled data and the second scrambled data to generate a first control selection signal. The scrambling selector may be configured to select and output the original data, the first scrambled data or the second scrambled data based on the first control selection signal. The error correction code (ECC) encoder may be configured to perform an ECC encoding operation of output data of the scrambling selector to generate encoded data to be outputted from the error correction apparatus. The ECC decoder may be configured to perform an ECC decoding operation of the encoded data, which are received by the error correction apparatus externally from the error correction apparatus, to generate decoded data corresponding to corrected data of the encoded data. The descrambling selector may be configured to output the decoded data to one route selected from a first route, a second route and a third route based on a second control selection signal. The first descrambler may be configured to descramble the decoded data to generate and output first descrambled data that are restored to have the same bit array sequence as the first scrambled data, if the descrambling selector outputs the decoded data to the first route. The second descrambler may be configured to descramble the first descrambled data or the decoded data to generate second descrambled data that are restored to have the same bit array sequence as the original data, if the first descrambler outputs the first descrambled data or the descrambling selector outputs the decoded data to the second route.

According to an embodiment, there may be provided an error correction method. The method may include randomizing original data to generate scrambled data, performing an error correction code (ECC) encoding operation of the scrambled data to generate encoded data to be outputted from the error correction apparatus, and performing an ECC decoding operation of the encoded data, which are received by the error correction apparatus externally from the error correction apparatus, to generate decoded data corresponding to corrected data of the encoded data. The decoded data having a bit array sequence randomized by the scrambler may be descrambled to generate descrambled data that may be restored to have the same bit array sequence as the original data.

According to an embodiment, there may be provided an error correction method. The method may include randomizing original data to generate scrambled data, comparing randomness of the original data with randomness of the scrambled data to generate a first control selection signal, selecting the original data or the scrambled data based on the first control selection signal, and performing an error correction code (ECC) encoding operation of the selected data of the original data and the scrambled data to generate encoded data to be outputted from the error correction apparatus. An ECC decoding operation of the encoded data, which are received by the error correction apparatus externally from the error correction apparatus, may be performed to generate decoded data corresponding to corrected data of the encoded data. According to a second control selection signal, the decoded data may be outputted to an external device or the decoded data may be descrambled to generate descrambled data that may be restored to have the same bit array sequence as the original data.

According to an embodiment, there may be provided an error correction method. The method may include firstly randomizing original data to generate first scrambled data, secondly randomizing the first scrambled data to generate second scrambled data, and performing an error correction code (ECC) encoding operation of the second scrambled data to generate encoded data to be outputted from the error correction apparatus. An ECC decoding operation of the encoded data, which are received by the error correction apparatus externally from the error correction apparatus, may be performed to generate decoded data corresponding to corrected data of the encoded data. The decoded data may be firstly descrambled to generate first descrambled data that are restored to have the same bit array sequence as the first scrambled data. The first descrambled data may be secondly descrambled to generate second descrambled data that are restored to have the same bit array sequence as the original data.

According to an embodiment, there may be provided an error correction method. The method may include firstly randomizing original data to generate first scrambled data, secondly randomizing the first scrambled data to generate second scrambled data, and analyzing randomness of the original data, the first scrambled data and the second scrambled data to generate a first control selection signal. The original data, the first scrambled data or the second scrambled data may be selected based on the first control selection signal. An error correction code (ECC) encoding operation of the selected data may be performed to generate encoded data to be outputted from the error correction apparatus. An ECC decoding operation of the encoded data, which are received by the error correction apparatus externally from the error correction apparatus, may be performed to generate decoded data corresponding to corrected data of the encoded data. According to a second control selection signal, the decoded data may be directly outputted to an external device, a first descrambling operation of the decoded data may be performed to generate first descrambled data that are restored to have the same bit array sequence as the first scrambled data, or a second descrambling operation of the decoded data may be performed to generate second descrambled data that are restored to have the same bit array sequence as the original data. If the first descrambled data are generated, the second descrambling operation of the first descrambled data may be performed to generate the second descrambled data that are restored to have the same bit array sequence as the original data.

In an embodiment, there may be provided a memory controller. The memory controller may include an error correction apparatus configured to perform a scrambling operation on original data before an error correction code (ECC) operation is performed to reduce the occurrence of errors in read data received by the error correction apparatus due to a noise effect rather than errors due to a soft error.

BRIEF DESCRIPTION OF THE DRAWINGS

FIGS. 22 to 31 are tables illustrating a process for deducing exclusive OR arithmetic equations used in realization of a logic circuit of the scrambler illustrated in FIG. 21.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to error correction apparatuses, error correction methods and memory controllers including the error correction apparatuses.

Figure 1:
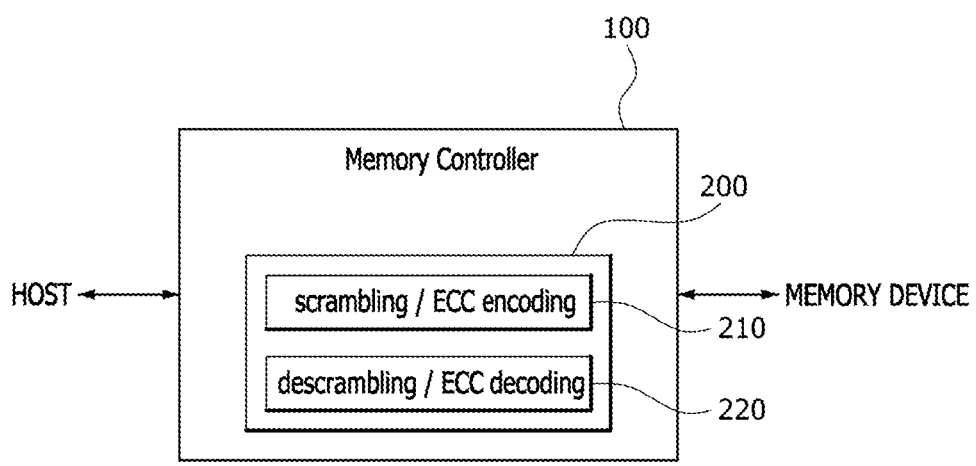
FIG. 1 is a block diagram illustrating a memory controller according to an embodiment.

FIG. 1 is a block diagram illustrating a memory controller 100 according to an embodiment. Referring to FIG. 1, the memory controller 100 may be coupled between a host and a memory device to act as an interface. The memory controller 100 may receive a command from the host to control various operations of the memory device. In general, the host may correspond to an upstream part that supplies data to the memory controller 100 and receives the data from the memory controller 100. The memory device may be a general memory device such as a NAND-type flash memory device or may be a new memory device such as a phase change random access memory (PCRAM) device, a magnetoresistive RAM (MRAM) device, a nano floating gate memory (NFGM) device, a resistive RAM (RRAM) device or a polymer RAM device. The memory controller 100 may include an error correction apparatus 200. The error correction apparatus 200 may include a scrambling and ECC (scrambling/ECC) encoding circuit 210 and a descrambling and ECC (descrambling/ECC) decoding circuit 220. The scrambling/ECC encoding circuit 210 may perform a scrambling operation and an ECC encoding operation of original data, which are written into the memory device, in response to a command outputted from the host. The descrambling/ECC decoding circuit 220 may perform and an ECC decoding operation and a descrambling operation of data outputted from the memory device, in response to a command outputted from the host.

Figure 2:
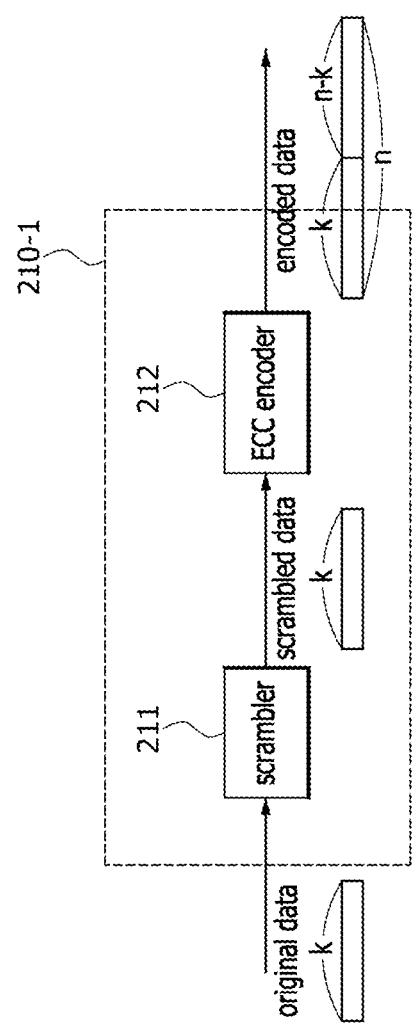
FIG. 2 is a block diagram illustrating an example of a scrambling/ECC encoding circuit included in the memory controller of FIG. 1.
Figure 3:
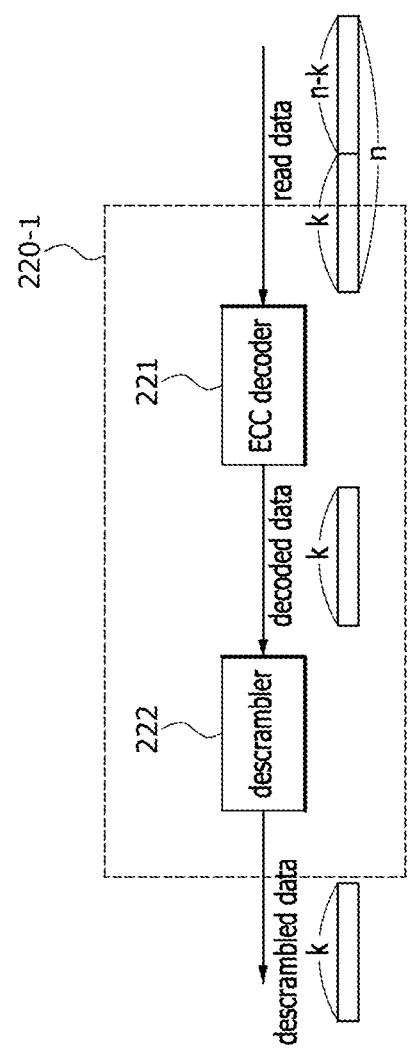
FIG. 3 is a block diagram illustrating an example of a descrambling/ECC decoding circuit included in the memory controller of FIG. 1.

FIG. 2 is a block diagram illustrating an example of the scrambling/ECC encoding circuit 210 included in the memory controller 100 of FIG. 1, and FIG. 3 is a block diagram illustrating an example of the descrambling/ECC decoding circuit 220 included in the memory controller 100 of FIG. 1. First, referring to FIG. 2, a scrambling/ECC encoding circuit 210-1 corresponding to an example of the scrambling/ECC encoding circuit 210 may be configured to include a scrambler 211 and an ECC encoder 212. The scrambler 211 may receive "k"-bit original data to randomize the "k"-bit original data and may output the randomized data as scrambled data. In an embodiment, for example, the scrambler 211 may be configured to randomize original data to generate scrambled data. If at least two bits having a logic "0" level or at least two bits having a logic "1" level are continuously arrayed in the "k"-bit original data, a noise effect may easily occur to cause a write error during a write operation. The scrambler 211 may randomly change an array sequence of bits included in the "k"-bit original data to minimize the number of bits which are continuously arrayed in the "k"-bit original data to have the same logic level. As a result, the probability that the write error occurs may be lowered. The ECC encoder 212 may perform an ECC encoding operation of the "k"-bit scrambled data outputted from the scrambler 211 to generate and output "n"-bit encoded data. The "n"-bit encoded data may be written into the memory device through an interface coupled between the memory controller 100 and the memory device. The "n"-bit encoded data may further include "(n-k)"-bit parity data in addition to the "k"-bit original data. In an embodiment, for example, 'n' and 'k' may represent natural numbers.

Next, referring to FIG. 3, a descrambling/ECC decoding circuit 220-1 corresponding to an example of the descrambling/ECC decoding circuit 220 may be configured to include an ECC decoder 221 and a descrambler 222. The ECC decoder 221 may receive read data (having a codeword form) stored in the memory device according to a read command outputted from the host. The read data may be configured to include the "k"-bit original data and the "(n-k)"-bit parity data like the encoded data which are encoded by the ECC encoder 212. The ECC decoder 221 may perform an ECC decoding operation for correcting an error of the read data, which is due to a soft error that occurs because of an inherent defect of the memory device during a write operation or a read operation. In an embodiment, the ECC decoding operation may be performed by a syndrome operation, an error location polynomial operation, an error location operation and an error correction operation. In an embodiment, the error location polynomial operation may be performed using a Berlekamp-Massey (BM) algorithm. In an embodiment, the ECC decoding operation may be performed using a reformulated inversionless Berlekamp-Massey (RiBM) algorithm or a simplified inversionless Berlekamp-Massey (SiBM) algorithm. The ECC decoder 221 may output "k"-bit decoded data which are corrected by an ECC decoding operation. The descrambler 222 may descramble the "k"-bit decoded data having a random bit sequence to generate and output descrambled data that are restored to have the same bit array sequence as the original data. In an embodiment, for example, the ECC decoder 212 may be configured to perform an ECC decoding operation of the encoded data, which are read out from the memory device, to generate decoded data corresponding to corrected data of the encoded data. In an embodiment, for example, the descrambler 222 may be configured to descramble the decoded data having a bit array sequence randomized by the scrambler 211 to generate descrambled data that are restored to have the same bit array sequence as the original data.

If the scrambling operation is performed after the ECC encoding operation terminates, the descrambling operation may be performed before the ECC decoding operation. In such a case, the bits of the data outputted from the scrambler after the ECC encoding operation is performed may be randomly arrayed. Thus, while the noise effect (due to at least two bits having the same logic level continuously arrayed) is suppressed during the read operation or the write operation, the read data may still have an error because of the soft error which is due to the inherent defect of the memory device. If the error due to the soft error of the memory device occurs, the read data inputted to the descrambler from the memory device may be different from the scrambled data outputted from the scrambler. In such a case, even though the ECC decoding operation of the descrambled data is performed, an error of the descrambled data may not be corrected. In contrast, as described with reference to FIGS. 2 and 3, the error correction apparatus 200 may perform the scrambling operation before the ECC encoding operation is performed. In such a case, since the ECC encoding operation is performed after the scrambling operation is performed to suppress the occurrence of an error due to the noise effect, the read data outputted from the memory device during the read operation may include only an error which is due to the soft error of the memory device. Accordingly, the read data inputted to the ECC decoder 221 from the memory device may include only an error which is due to the soft error of the memory device, and the ECC decoder 221 may correct the error of the read data to output the decoded data. The decoded data may be identical to the scrambled data generated by the scrambler 211.

Figure 4:
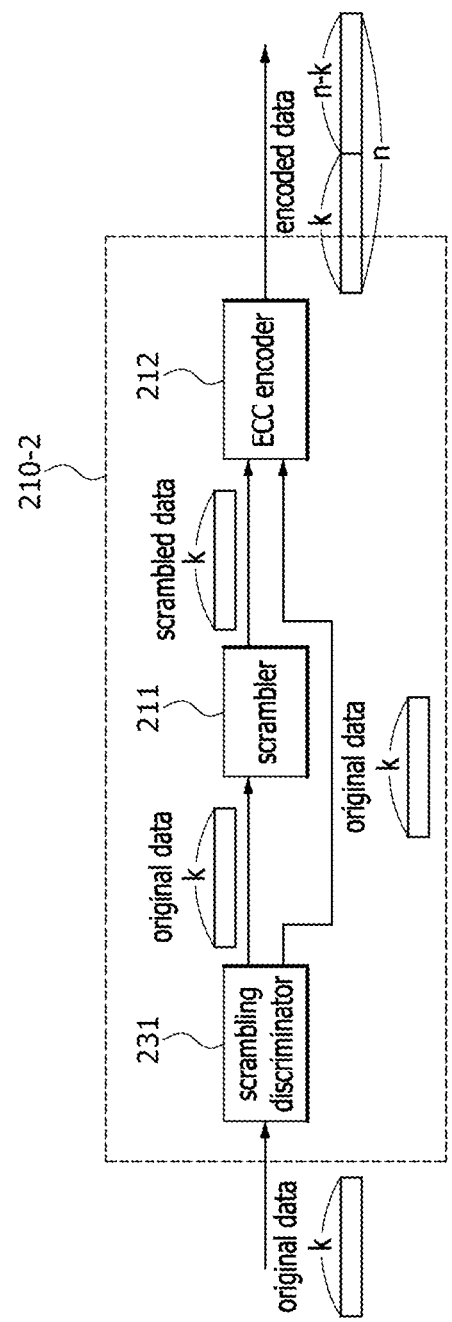
FIG. 4 is a block diagram illustrating another example of a scrambling/ECC encoding circuit included in the memory controller of FIG. 1.
Figure 5:
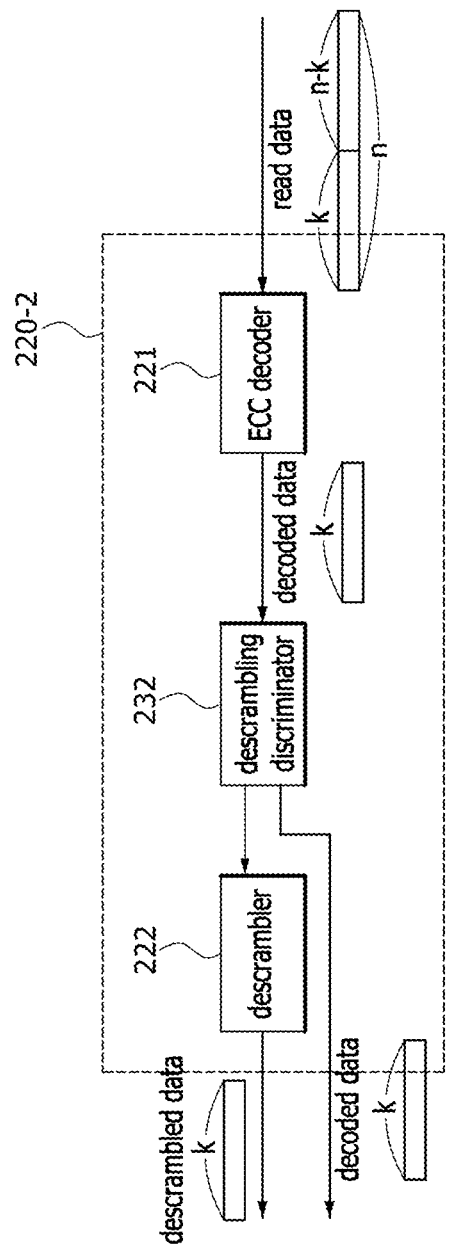
FIG. 5 is a block diagram illustrating another example of a descrambling/ECC decoding circuit included in the memory controller of FIG. 1.

FIG. 4 is a block diagram illustrating another example of the scrambling/ECC encoding circuit 210 included in the memory controller 100 of FIG. 1, and FIG. 5 is a block diagram illustrating another example of the descrambling/ECC decoding circuit 220 included in the memory controller 100 of FIG. 1. In FIGS. 4 and 5, the same reference numerals or the same reference designators as used in FIGS. 2 and 3 denote the same elements. First, referring to FIG. 4, a scrambling/ECC encoding circuit 210-2 corresponding to another example of the scrambling/ECC encoding circuit 210 may be configured to include a scrambling discriminator 231, the scrambler 211 and the ECC encoder 212. The scrambling discriminator 231 may receive the "k"-bit original data to discriminate whether the scrambling operation of the "k"-bit original data is required. That is, if at least two bits having a logic "0" level or at least two bits having a logic "1" level are continuously arrayed in the "k"-bit original data, the scrambling discriminator 231 may supply the "k"-bit original data to the scrambler 211 to suppress the occurrence of the noise effect. Subsequently, the same operations as described with reference to FIG. 2 may be performed. If two or more bits having a logic "0" level or two or more bits having a logic "1" level are not continuously arrayed in the "k"-bit original data, the scrambling discriminator 231 may supply the "k"-bit original data to the ECC encoder 212 because the possibility of the occurrence of the noise effect is low. That is, in such a case, the scrambling operation may be omitted.

Next, referring to FIG. 5, a descrambling/ECC decoding circuit 220-2 corresponding to another example of the descrambling/ECC decoding circuit 220 may be configured to include the ECC decoder 221, the descrambler 222 and a descrambling discriminator 232. As described with reference to FIG. 3, the ECC decoder 221 may receive the read data (having a codeword form) stored in the memory device according to a read command outputted from the host and may perform the ECC decoding operation for correcting an error of the read data to generate and output the "k"-bit decoded data. The "k"-bit decoded data may be inputted to the descrambling discriminator 232. The descrambling discriminator 232 may discriminate whether the decoded data correspond to data which are scrambled before the ECC encoding operation is performed by the ECC encoder 212 of the scrambling/ECC encoding circuit 210-2. If the decoded data correspond to data which are scrambled before the ECC encoding operation is performed by the ECC encoder 212, the descrambling discriminator 232 may supply the decoded data to the descrambler 222 so that the descrambler 222 restores the decoded data. If the decoded data correspond to data which are not scrambled, the descrambling discriminator 232 may directly transmit the decoded data to a host interface between the host and the memory controller 100 or to another circuit included in the memory controller 100.

Figure 6:
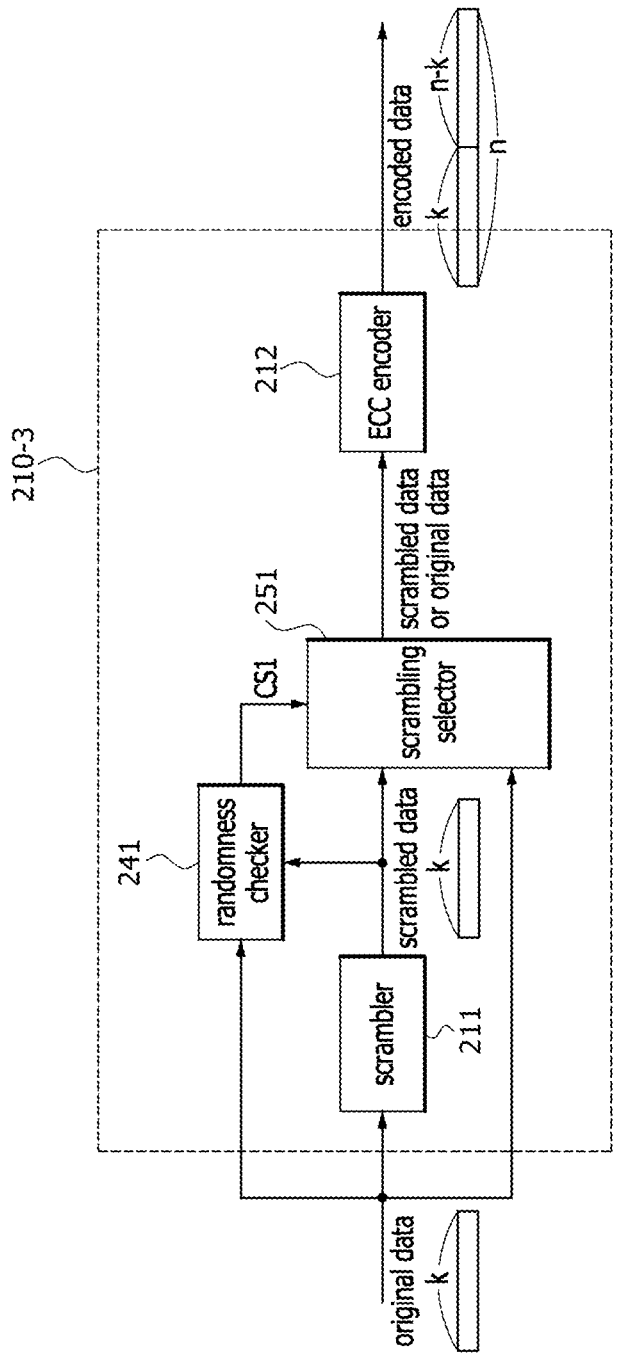
FIG. 6 is a block diagram illustrating yet another example of a scrambling/ECC encoding circuit included in the memory controller of FIG. 1.
Figure 7:
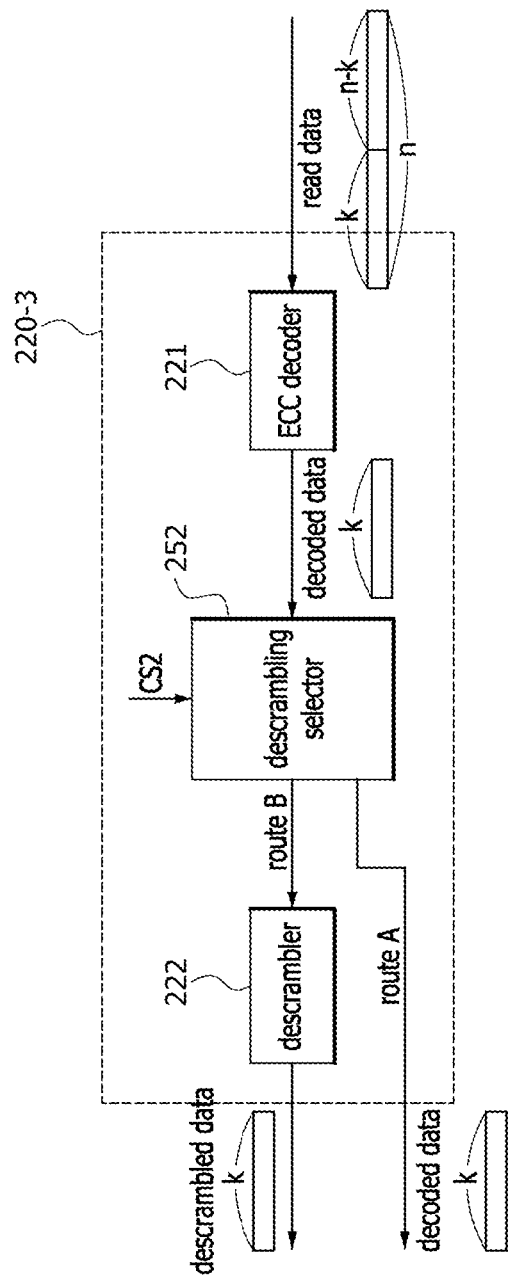
FIG. 7 is a block diagram illustrating yet another example of a descrambling/ECC decoding circuit included in the memory controller of FIG. 1.

FIG. 6 is a block diagram illustrating yet another example of the scrambling/ECC encoding circuit 210 included in the memory controller 100 of FIG. 1, and FIG. 7 is a block diagram illustrating yet another example of the descrambling/ECC decoding circuit 220 included in the memory controller 100 of FIG. 1. In FIGS. 6 and 7, the same reference numerals or the same reference designators as used in FIGS. 2 and 3 denote the same elements. First, referring to FIG. 6, a scrambling/ECC encoding circuit 210-3 corresponding to yet another example of the scrambling/ECC encoding circuit 210 may be configured to include the scrambler 211, a randomness checker 241, a scrambling selector 251 and the ECC encoder 212. The "k"-bit original data inputted to the scrambling/ECC encoding circuit 210-3 may be supplied to both of the scrambler 211 and the scrambling selector 251 in common. The scrambler 211 may randomize the "k"-bit original data to output the randomized data as scrambled data. The scrambled data may be inputted to both of the randomness checker 241 and the scrambling selector 251 in common. The randomness checker 241 may select the "k"-bit original data or the scrambled data and may output a first control selection signal CS1 including information on the selected data of the "k"-bit original data and the scrambled data to the scrambling selector 251. If the number of bits which are continuously arrayed in the "k"-bit original data to have the same logic level is less than the number of bits which are continuously arrayed in the scrambled data to have the same logic level, the first control selection signal CS1 may be generated to include information on the "k"-bit original data.

On the contrary, if the number of bits which are continuously arrayed in the "k"-bit original data to have the same logic level is greater than the number of bits which are continuously arrayed in the scrambled data to have the same logic level, the first control selection signal CS1 may be generated to include information on the scrambled data. The scrambling selector 251 may output the "k"-bit original data or the scrambled data to the ECC encoder 212, in response to the first control selection signal CS1. The ECC encoder 212 may perform an ECC encoding operation of the "k"-bit original data or the scrambled data to generate and output "n"-bit encoded data. The "n"-bit encoded data may be written into the memory device through an interface coupled between the memory controller 100 and the memory device. In an embodiment, the randomness checker 241 or the scrambling selector 251 may generate a flag (not illustrated) including information on whether the encoded data correspond to the scrambled data or the original data. The flag may be stored in the memory device together with the encoded data so that the scrambling information of the flag is used during a read operation for reading out the encoded data stored in the memory device.

Next, referring to FIG. 7, a descrambling/ECC decoding circuit 220-3 corresponding to yet another example of the descrambling/ECC decoding circuit 220 may be configured to include the ECC decoder 221, a descrambling selector 252 and the descrambler 222. The ECC decoder 221 may receive the read data (having a codeword form) stored in the memory device according to a read command outputted from the host. The ECC decoder 221 may perform the ECC decoding operation for correcting an error of the read data to generate and output the "k"-bit decoded data. The "k"-bit decoded data may be inputted to the descrambling selector 252. The descrambling selector 252 may supply the "k"-bit decoded data to the descrambler 222 or an external device out of the error correction apparatus 200, in response to a second control selection signal CS2. The second control selection signal CS2 inputted to the descrambling selector 252 may be provided by a circuit included in the error correction apparatus 200. In such a case, the circuit outputting the second control selection signal CS2 may generate the second control selection signal CS2 based on the scrambling information of the flag stored in the memory device.

If the second control selection signal CS2 is generated on the basis of the scrambling information on that the read data do not correspond to the scrambled data, the descrambling selector 252 may directly supply the "k"-bit decoded data to an external device out of the error correction apparatus 200 (see a route A). If the second control selection signal CS2 is generated on the basis of the scrambling information on that the read data correspond to the scrambled data, the descrambling selector 252 may supply the "k"-bit decoded data to the descrambler 222 (see a route B). The descrambler 222 may descramble the "k"-bit decoded data having a random bit sequence to generate and output descrambled data that are restored to have the same bit array sequence as the original data.

Figure 8:
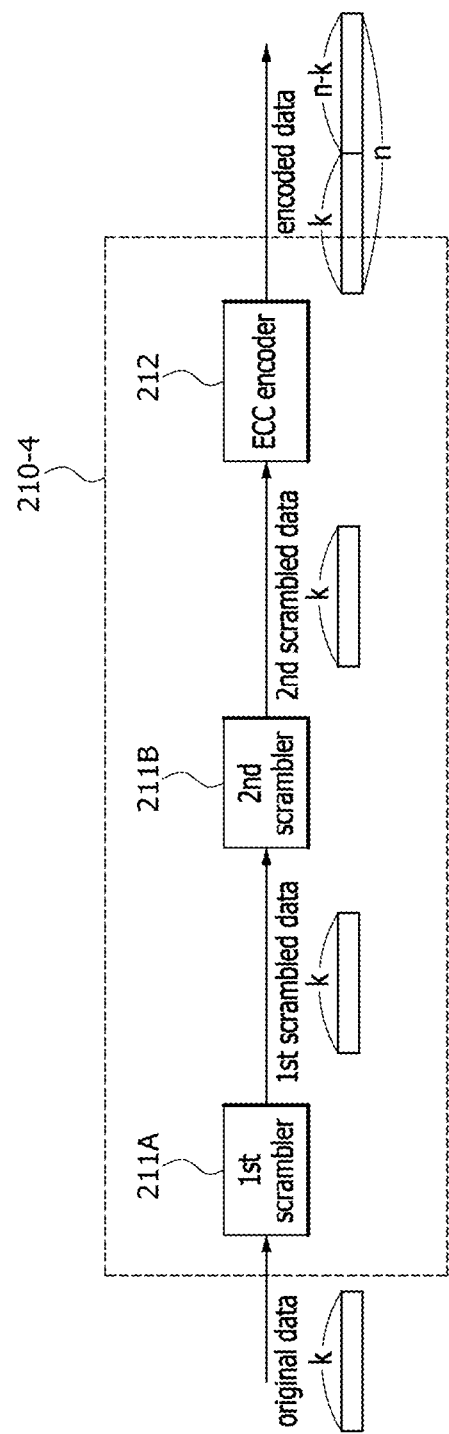
FIG. 8 is a block diagram illustrating still another example of a scrambling/ECC encoding circuit included in the memory controller of FIG. 1.
Figure 9:
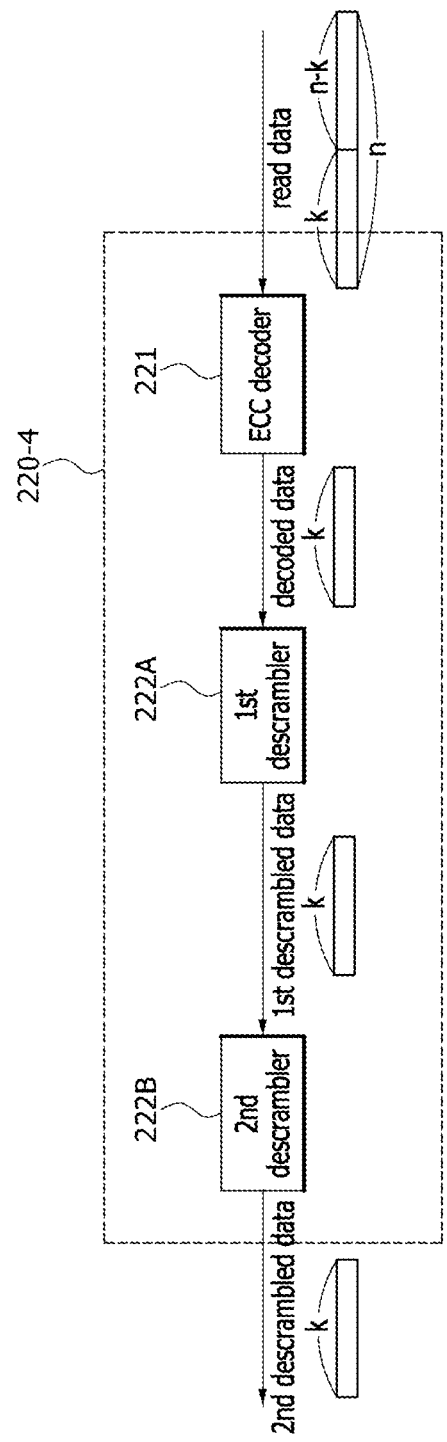
FIG. 9 is a block diagram illustrating still another example of a descrambling/ECC decoding circuit included in the memory controller of FIG. 1.

FIG. 8 is a block diagram illustrating still another example of the scrambling/ECC encoding circuit 210 included in the memory controller 100 of FIG. 1, and FIG. 9 is a block diagram illustrating still another example of the descrambling/ECC decoding circuit 220 included in the memory controller 100 of FIG. 1. In FIGS. 8 and 9, the same reference numerals or the same reference designators as used in FIGS. 2 and 3 denote the same elements. First, referring to FIG. 8, a scrambling/ECC encoding circuit 210-4 corresponding to still another example of the scrambling/ECC encoding circuit 210 may be configured to include a first scrambler 211A, a second scrambler 211B and the ECC encoder 212. The first scrambler 211A may firstly randomize the "k"-bit original data to generate and output "k"-bit first scrambled data. The second scrambler 211B may secondly randomize the "k"-bit first scrambled data to generate and output "k"-bit second scrambled data. The ECC encoder 212 may perform an ECC encoding operation of the "k"-bit second scrambled data to generate and output "n"-bit encoded data. The "n"-bit encoded data may be written into the memory device through an interface coupled between the memory controller 100 and the memory device.

Next, referring to FIG. 9, a descrambling/ECC decoding circuit 220-4 corresponding to still another example of the descrambling/ECC decoding circuit 220 may be configured to include the ECC decoder 221, a first descrambler 222A and a second descrambler 222B. The ECC decoder 221 may receive read data (having a codeword form) stored in the memory device according to a read command outputted from the host. The ECC decoder 221 may perform an ECC decoding operation for correcting an error of the read data to generate and output "k"-bit decoded data. The first descrambler 222A may descramble the "k"-bit decoded data to generate and output first descrambled data that are restored to have the same bit array sequence as the first scrambled data. The second descrambler 222B may descramble the "k"-bit first descrambled data to generate and output second descrambled data that are restored to have the same bit array sequence as the original data.

Figure 10:
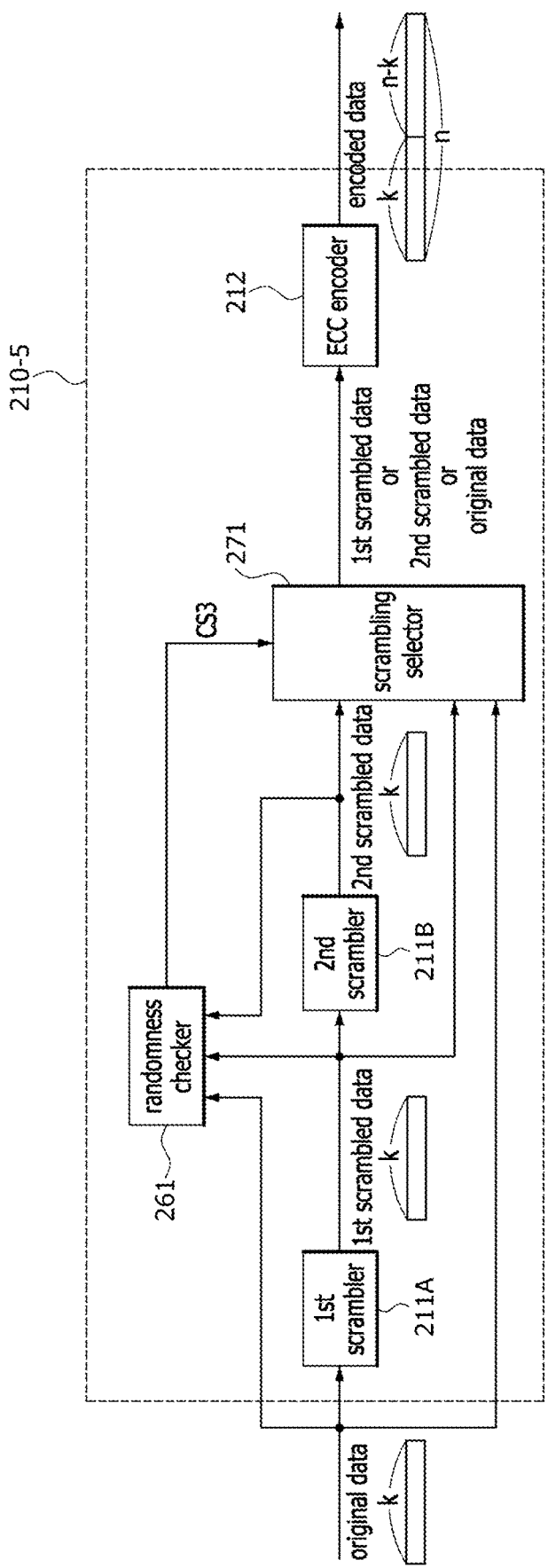
FIG. 10 is a block diagram illustrating yet still another example of a scrambling/ECC encoding circuit included in the memory controller of FIG. 1.
Figure 11:
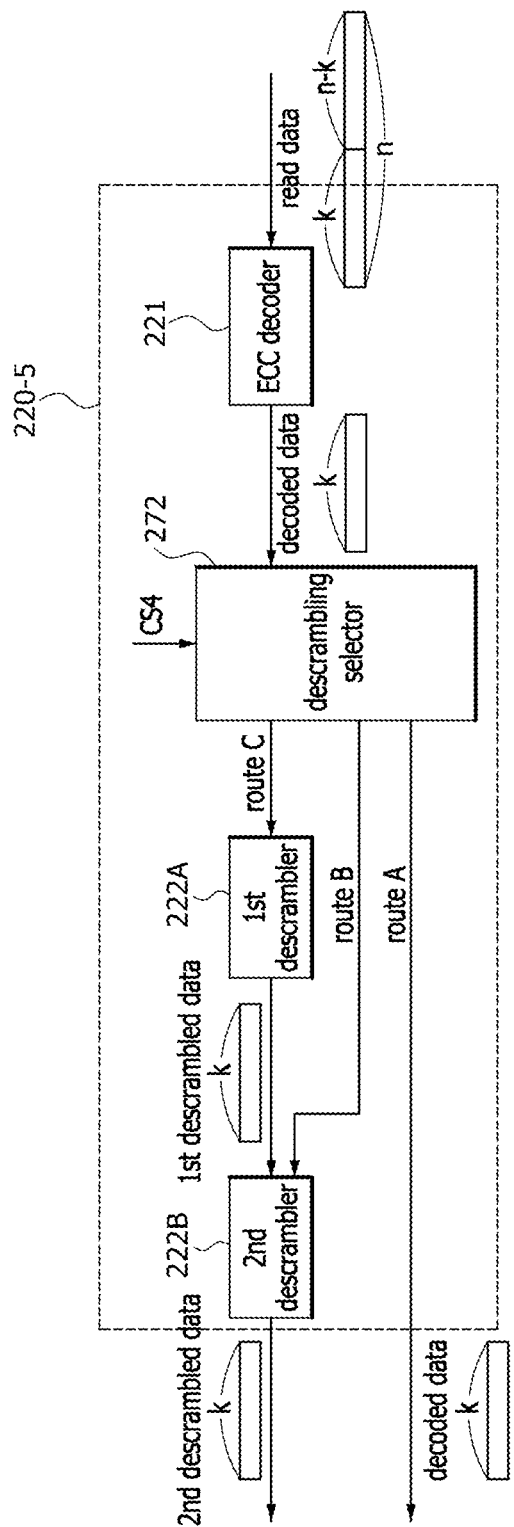
FIG. 11 is a block diagram illustrating yet still another example of a descrambling/ECC decoding circuit included in the memory controller of FIG. 1.

FIG. 10 is a block diagram illustrating yet still another example of the scrambling/ECC encoding circuit 210 included in the memory controller 100 of FIG. 1, and FIG. 11 is a block diagram illustrating yet still another example of the descrambling/ECC decoding circuit 220 included in the memory controller 100 of FIG. 1. In FIGS. 10 and 11, the same reference numerals or the same reference designators as used in FIGS. 8 and 9 denote the same elements. First, referring to FIG. 10, a scrambling/ECC encoding circuit 210-5 corresponding to yet still another example of the scrambling/ECC encoding circuit 210 may be configured to include the first scrambler 211A, the second scrambler 211B, a randomness checker 261, a scrambling selector 271 and the ECC encoder 212. The "k"-bit original data inputted to the scrambling/ECC encoding circuit 210-5 may be supplied to the first scrambler 211A, the randomness checker 261 and the scrambling selector 271. The first scrambler 211A may firstly randomize the "k"-bit original data to generate and output "k"-bit first scrambled data. The "k"-bit first scrambled data may be inputted to the second scrambler 211B, the randomness checker 261 and the scrambling selector 271. The second scrambler 211B may secondly randomize the "k"-bit first scrambled data to generate and output "k"-bit second scrambled data. The "k"-bit second scrambled data may be inputted to the randomness checker 261 and the scrambling selector 271.

The randomness checker 261 may select the original data, the first scrambled data or the second scrambled data and may output a first control selection signal CS3 including information on the selected data of the original data, the first scrambled data and the second scrambled data to the scrambling selector 271. If the number of bits which are continuously arrayed in the "k"-bit original data to have the same logic level is less than the number of bits which are continuously arrayed in the first scrambled data to have the same logic level and the number of bits which are continuously arrayed in the second scrambled data to have the same logic level, the first control selection signal CS3 may be generated to include information on the "k"-bit original data. If the number of bits which are continuously arrayed in the first scrambled data to have the same logic level is less than the number of bits which are continuously arrayed in the original data to have the same logic level and the number of bits which are continuously arrayed in the second scrambled data to have the same logic level, the first control selection signal CS3 may be generated to include information on the first scrambled data. If the number of bits which are continuously arrayed in the second scrambled data to have the same logic level is less than the number of bits which are continuously arrayed in the original data to have the same logic level and the number of bits which are continuously arrayed in the first scrambled data to have the same logic level, the first control selection signal CS3 may be generated to include information on the second scrambled data. The scrambling selector 271 may output the "k"-bit original data, the first scrambled data or the second scrambled data to the ECC encoder 212, in response to the first control selection signal CS3. The ECC encoder 212 may perform an ECC encoding operation of data outputted from the scrambling selector 271 to generate and output "n"-bit encoded data. The "n"-bit encoded data may be written into the memory device through an interface coupled between the memory controller 100 and the memory device. In an embodiment, the randomness checker 261 or the scrambling selector 271 may generate a flag (not shown) including information on whether the encoded data correspond to the scrambled data or the original data. The flag may be stored in the memory device together with the encoded data so that the scrambling information of the flag is used during a read operation for reading out the encoded data stored in the memory device.

Next, referring to FIG. 11, a descrambling/ECC decoding circuit 220-5 corresponding to yet still another example of the descrambling/ECC decoding circuit 220 may be configured to include the ECC decoder 221, a descrambling selector 272, the first descrambler 222A and the second descrambler 222B. The ECC decoder 221 may receive "n"-bit read data (having a codeword form) stored in the memory device according to a read command outputted from the host. The ECC decoder 221 may perform an ECC decoding operation for correcting an error of the read data to generate and output "k"-bit decoded data. The "k"-bit decoded data may be inputted to the descrambling selector 272. The descrambling selector 272 may supply the "k"-bit decoded data to the first descrambler 222A, the second descrambler 222B or an external device out of the error correction apparatus 200, in response to a second control selection signal CS4. The second control selection signal CS4 inputted to the descrambling selector 272 may be provided by a circuit included in the error correction apparatus 200. In such a case, the circuit outputting the second control selection signal CS4 may generate the second control selection signal CS4 based on the scrambling information of the flag stored in the memory device.

If the second control selection signal CS4 is generated on the basis of the scrambling information on that the read data do not correspond to the scrambled data, the descrambling selector 272 may directly supply the "k"-bit decoded data to an external device out of the error correction apparatus 200 (see route A). If the second control selection signal CS4 is generated on the basis of the scrambling information on that the read data correspond to the first scrambled data, the descrambling selector 272 may supply the "k"-bit decoded data to the second descrambler 222B (see route B). The second descrambler 222B may descramble the "k"-bit decoded data to generate and output second descrambled data that are restored to have the same bit array sequence as the original data.

If the second control selection signal CS4 is generated on the basis of the scrambling information on that the read data correspond to the second scrambled data, the descrambling selector 272 may supply the "k"-bit decoded data to the first descrambler 222A (see a route C). The first descrambler 222A may descramble the "k"-bit decoded data to generate and output first descrambled data that are restored to have the same bit array sequence as the first scrambled data. The second descrambler 222B may descramble the first descrambled data to generate and output second descrambled data that are restored to have the same bit array sequence as the original data.

Figure 12:
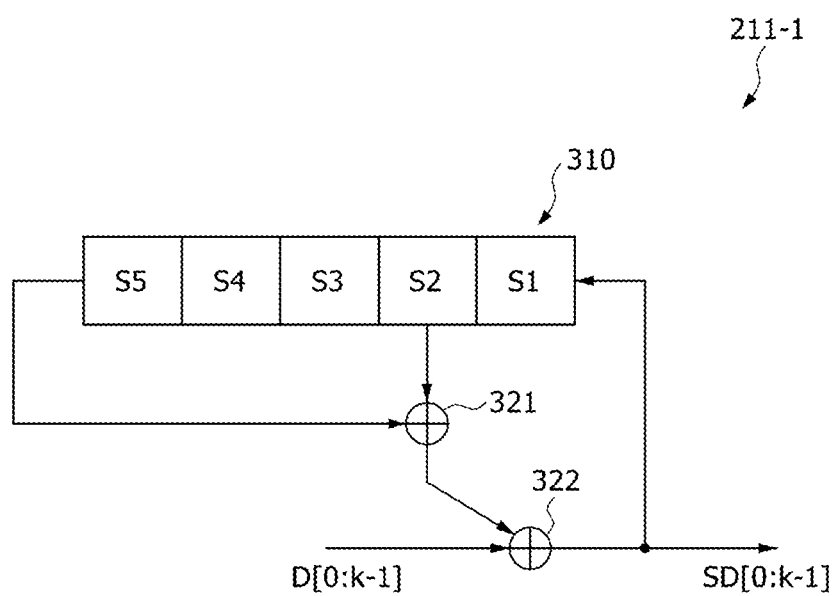
FIG. 12 is a schematic view illustrating an example of a scrambler included in the scrambling/ECC encoding circuit of FIG. 2.
Figure 13:
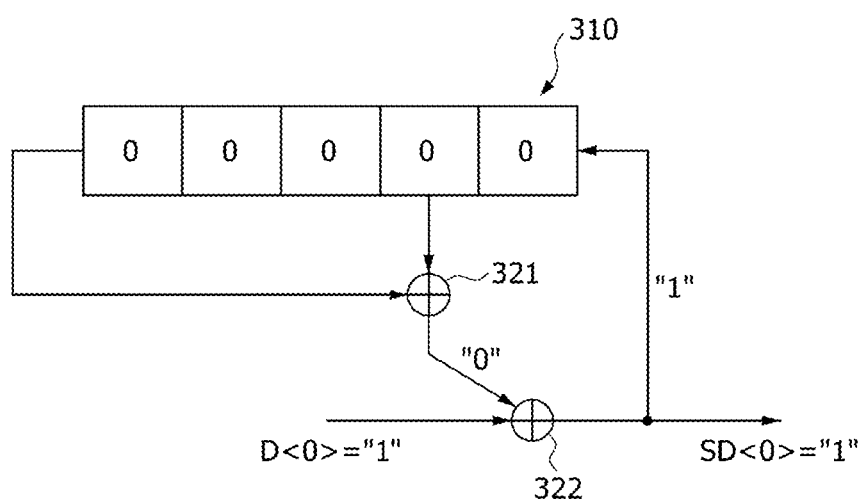
FIGS. 13 to 20 are schematic views illustrating an operation of the scrambler illustrated in FIG. 12.

FIG. 12 is a schematic view illustrating an example of the scrambler 211 included in the scrambling/ECC encoding circuit 210-1 of FIG. 2. A scrambler 211-1 corresponding to an example of the scrambler 211 may also be equally applied to the scramblers 211 of FIGS. 4 and 6 as well as the first and second scramblers 211A and 211B of FIGS. 8 and 10. Referring to FIG. 12, the scrambler 211-1 may include a linear feedback shift register (LFSR) 310 having a plurality of storage elements. Although FIG. 12 illustrates an example in which the LFSR 310 has five storage elements S1~S5 (i.e., first to fifth storage elements S1~S5), the present disclosure is not limited thereto. For example, in some embodiments, the number of the storage elements included in the LFSR 310 may be less or greater than five. Data of the second and fifth storage elements S2 and S5 among the first to fifth storage elements S1~S5 included in the LFSR 310 may be inputted to a first exclusive OR (XOR) arithmetic element 321. The first XOR arithmetic element 321 may perform an XOR operation of the data stored in the second storage element S2 and the data stored in the fifth storage element S5 and may output the result of the XOR operation to a second XOR arithmetic element 322. The second XOR arithmetic element 322 may sequentially receive "k"-number of bit data included in "k"-bit original data D<0:K-1> which are inputted to the error correction apparatus (200 of FIG. 1). Accordingly, the second XOR arithmetic element 322 may perform an XOR operation of each bit datum of the "k"-bit original data D<0:K-1> and an output datum of the first XOR arithmetic element 321 and may output the result of the XOR operation as one bit datum of scrambled data SD<0:K-1>. That is, the scrambled data SD<0:K-1> outputted from the second XOR arithmetic element 322 may correspond to the scrambled data outputted from the scrambler 211.

FIGS. 13 to 20 are schematic views illustrating an operation of the scrambler 211-1 illustrated in FIG. 12. In the embodiment illustrated in FIGS. 13 to 20, it is assumed that the original data inputted to the scrambler 211-1 have 8-bit data, for example a data stream of '10000000'. First, referring to FIG. 13, the LFSR 310 may be reset so that all of the storage elements S1~S5 have a datum "0". Thus, the datum "0" stored in the second storage element S2 and the datum "0" stored in the fifth storage element S5 may be inputted to the first XOR arithmetic element 321. The first XOR arithmetic element 321 may perform an XOR operation of the datum "0" outputted from the second storage element S2 and the datum "0" outputted from the fifth storage element S5 to generate and output a datum "0" to the second XOR arithmetic element 322. If a datum "1" corresponding to the first bit datum D<0> of the original data is inputted to the second XOR arithmetic element 322, the second XOR arithmetic element 322 may perform an XOR operation of the datum "1" corresponding to the first bit datum D<0> of the original data and the datum "0" outputted from the first XOR arithmetic element 321 to generate and output a datum "1". This datum "1" outputted from the second XOR arithmetic element 322 may be fed back to and stored into the first storage element S1 and may also be used as a first bit datum SD<0> of the scrambled data outputted from the scrambler 211.

Figure 14:
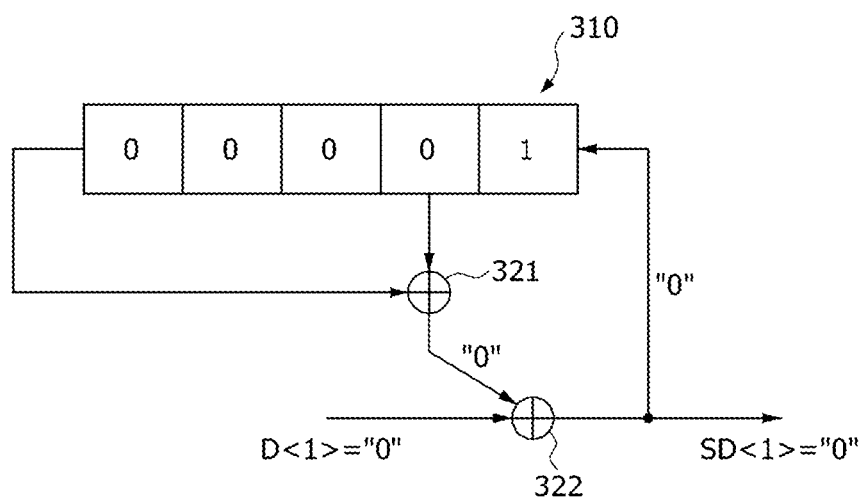

Next, referring to FIG. 14, as the feedback datum "1" is stored into the first storage element S1 of the LFSR 310, the first to fifth storage elements S1~S5 may respectively have data of "1", "0", "0", "0" and "0". The datum "0" stored in the second storage element S2 and the datum "0" stored in the fifth storage element S5 may be inputted to the first XOR arithmetic element 321. The first XOR arithmetic element 321 may perform an XOR operation of the datum "0" outputted from the second storage element S2 and the datum "0" outputted from the fifth storage element S5 to generate and output a datum "0" to the second XOR arithmetic element 322. If a datum "0" corresponding to the second bit datum D<1> of the original data is inputted to the second XOR arithmetic element 322, the second XOR arithmetic element 322 may perform an XOR operation of the datum "0" corresponding to the second bit datum D<1> of the original data and the datum "0" outputted from the first XOR arithmetic element 321 to generate and output a datum "0". This datum "0" outputted from the second XOR arithmetic element 322 may be fed back to and stored into the first storage element S1 and may also be used as a second bit datum SD<1> of the scrambled data outputted from the scrambler 211.

Figure 15:
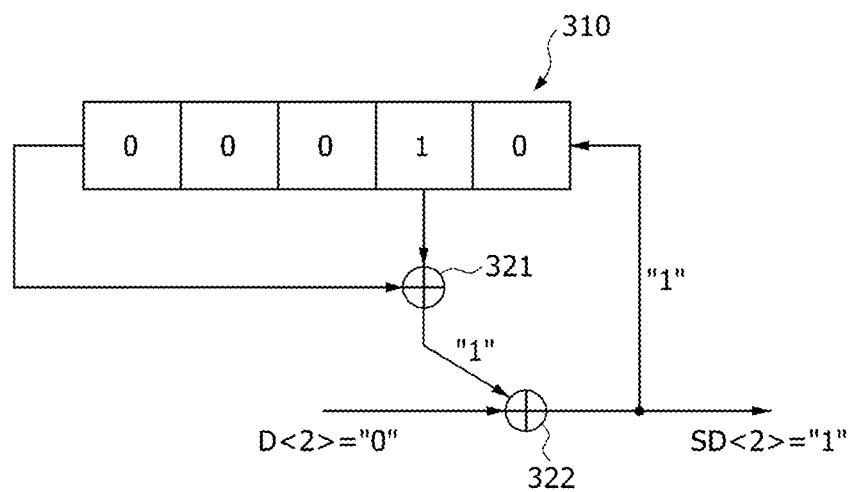

Next, referring to FIG. 15, as the feedback datum "0" is stored into the first storage element S1 of the LFSR 310, the first to fifth storage elements S1~S5 may respectively have data of "0", "1", "0", "0" and "0". The datum "1" stored in the second storage element S2 and the datum "0" stored in the fifth storage element S5 may be inputted to the first XOR arithmetic element 321. The first XOR arithmetic element 321 may perform an XOR operation of the datum "1" outputted from the second storage element S2 and the datum "0" outputted from the fifth storage element S5 to generate and output a datum "1" to the second XOR arithmetic element 322. If a datum "0" corresponding to the third bit datum D<2> of the original data is inputted to the second XOR arithmetic element 322, the second XOR arithmetic element 322 may perform an XOR operation of the datum "0" corresponding to the third bit datum D<2> of the original data and the datum "1" outputted from the first XOR arithmetic element 321 to generate and output a datum "1". This datum "1" outputted from the second XOR arithmetic element 322 may be fed back to and stored into the first storage element S1 and may also be used as a third bit datum SD<2> of the scrambled data outputted from the scrambler 211.

Figure 16:
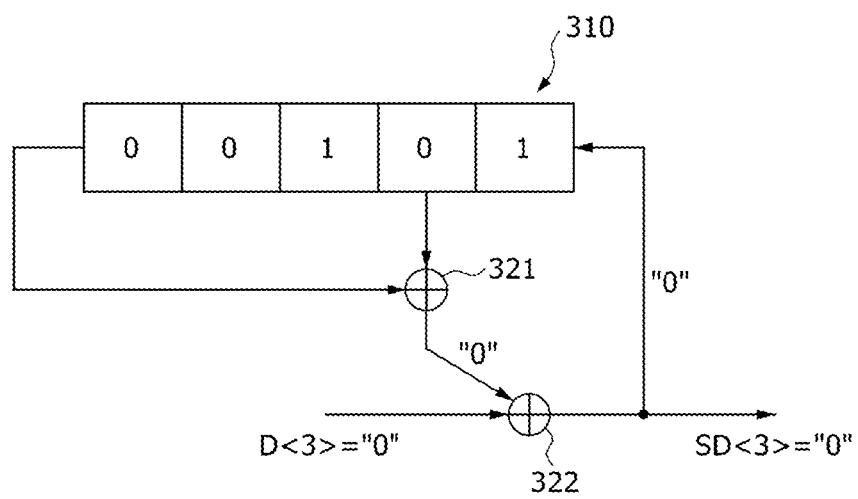

Next, referring to FIG. 16, as the feedback datum "1" is stored into the first storage element S1 of the LFSR 310, the first to fifth storage elements S1~S5 may respectively have data of "1", "0", "1", "0" and "0". The datum "0" stored in the second storage element S2 and the datum "0" stored in the fifth storage element S5 may be inputted to the first XOR arithmetic element 321. The first XOR arithmetic element 321 may perform an XOR operation of the datum "0" outputted from the second storage element S2 and the datum "0" outputted from the fifth storage element S5 to generate and output a datum "0" to the second XOR arithmetic element 322. If a datum "0" corresponding to the fourth bit datum D<3> of the original data is inputted to the second XOR arithmetic element 322, the second XOR arithmetic element 322 may perform an XOR operation of the datum "0" corresponding to the fourth bit datum D<3> of the original data and the datum "0" outputted from the first XOR arithmetic element 321 to generate and output a datum "0". This datum "0" outputted from the second XOR arithmetic element 322 may be fed back to and stored into the first storage element S1 and may also be used as a fourth bit datum SD<3> of the scrambled data outputted from the scrambler 211.

Figure 17:
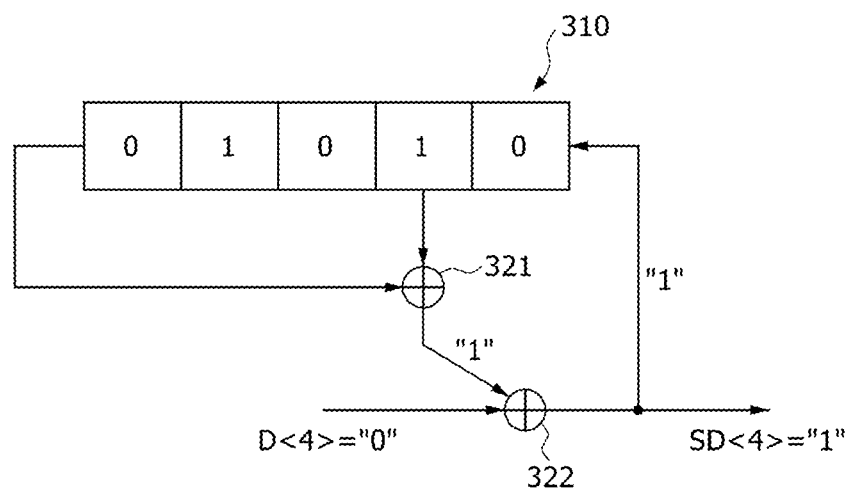

Next, referring to FIG. 17, as the feedback datum "0" is stored into the first storage element S1 of the LFSR 310, the first to fifth storage elements S1~S5 may respectively have data of "0", "1", "0", "1" and "0". The datum "1" stored in the second storage element S2 and the datum "0" stored in the fifth storage element S5 may be inputted to the first XOR arithmetic element 321. The first XOR arithmetic element 321 may perform an XOR operation of the datum "1" outputted from the second storage element S2 and the datum "0" outputted from the fifth storage element S5 to generate and output a datum "1" to the second XOR arithmetic element 322. If a datum "0" corresponding to the fifth bit datum D<4> of the original data is inputted to the second XOR arithmetic element 322, the second XOR arithmetic element 322 may perform an XOR operation of the datum "0" corresponding to the fifth bit datum D<4> of the original data and the datum "1" outputted from the first XOR arithmetic element 321 to generate and output a datum "1". This datum "1" outputted from the second XOR arithmetic element 322 may be fed back to and stored into the first storage element S1 and may also be used as a fifth bit datum SD<4> of the scrambled data outputted from the scrambler 211.

Figure 18:
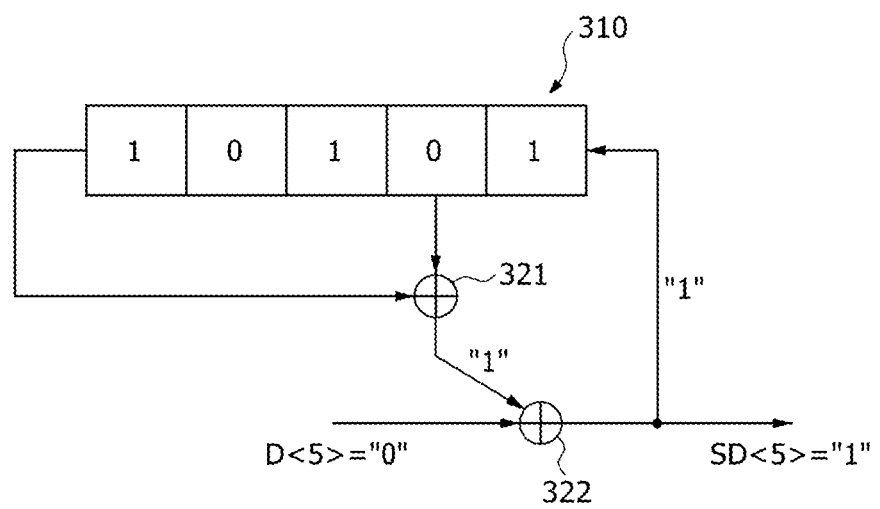

Next, referring to FIG. 18, as the feedback datum "1" is stored into the first storage element S1 of the LFSR 310, the first to fifth storage elements S1~S5 may respectively have data of "1", "0", "1", "0" and "1". The datum "0" stored in the second storage element S2 and the datum "1" stored in the fifth storage element S5 may be inputted to the first XOR arithmetic element 321. The first XOR arithmetic element 321 may perform an XOR operation of the datum "0" outputted from the second storage element S2 and the datum "1" outputted from the fifth storage element S5 to generate and output a datum "1" to the second XOR arithmetic element 322. If a datum "0" corresponding to the sixth bit datum D<5> of the original data is inputted to the second XOR arithmetic element 322, the second XOR arithmetic element 322 may perform an XOR operation of the datum "0" corresponding to the sixth bit datum D<5> of the original data and the datum "1" outputted from the first XOR arithmetic element 321 to generate and output a datum "1". This datum "1" outputted from the second XOR arithmetic element 322 may be fed back to and stored into the first storage element S1 and may also be used as a sixth bit datum SD<5> of the scrambled data outputted from the scrambler 211.

Figure 19:
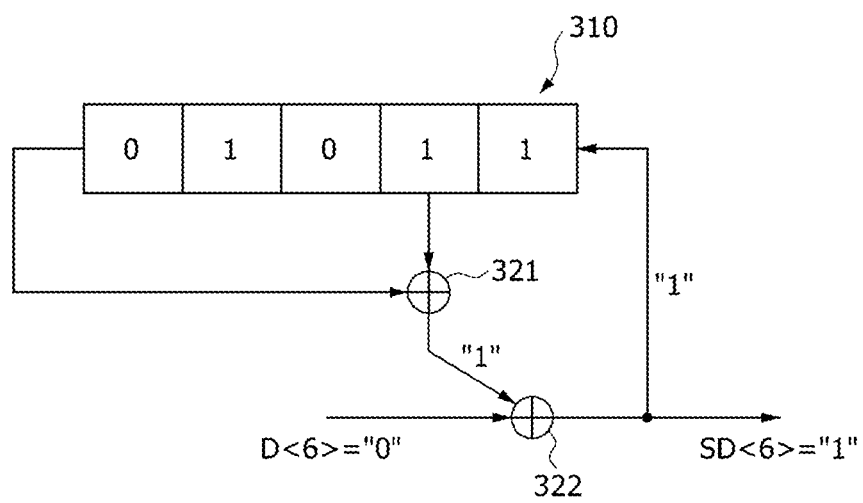

Next, referring to FIG. 19, as the feedback datum "1" is stored into the first storage element S1 of the LFSR 310, the first to fifth storage elements S1~S5 may respectively have data of "1", "1", "0", "1" and "0". The datum "1" stored in the second storage element S2 and the datum "0" stored in the fifth storage element S5 may be inputted to the first XOR arithmetic element 321. The first XOR arithmetic element 321 may perform an XOR operation of the datum "1" outputted from the second storage element S2 and the datum "0" outputted from the fifth storage element S5 to generate and output a datum "1" to the second XOR arithmetic element 322. If a datum "0" corresponding to the seventh bit datum D<6> of the original data is inputted to the second XOR arithmetic element 322, the second XOR arithmetic element 322 may perform an XOR operation of the datum "0" corresponding to the seventh bit datum D<6> of the original data and the datum "1" outputted from the first XOR arithmetic element 321 to generate and output a datum "1". This datum "1" outputted from the second XOR arithmetic element 322 may be fed back to and stored into the first storage element S1 and may also be used as a seventh bit datum SD<6> of the scrambled data outputted from the scrambler 211.

Figure 20:
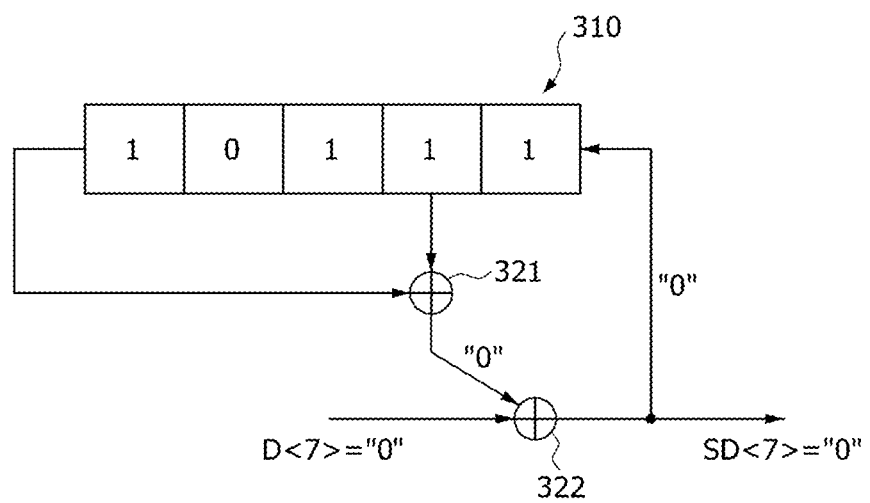

Next, referring to FIG. 20, as the feedback datum "1" is stored into the first storage element S1 of the LFSR 310, the first to fifth storage elements S1~S5 may respectively have data of "1", "1", "1", "0" and "1". The datum "1" stored in the second storage element S2 and the datum "1" stored in the fifth storage element S5 may be inputted to the first XOR arithmetic element 321. The first XOR arithmetic element 321 may perform an XOR operation of the datum "1" outputted from the second storage element S2 and the datum "1" outputted from the fifth storage element S5 to generate and output a datum "0" to the second XOR arithmetic element 322. If a datum "0" corresponding to the eighth bit datum D<7> of the original data is inputted to the second XOR arithmetic element 322, the second XOR arithmetic element 322 may perform an XOR operation of the datum "0" corresponding to the eighth bit datum D<7> of the original data and the datum "0" outputted from the first XOR arithmetic element 321 to generate and output a datum "0". This datum "0" outputted from the second XOR arithmetic element 322 may be fed back to and stored into the first storage element S1 and may also be used as an eighth bit datum SD<7> of the scrambled data outputted from the scrambler 211.

As described with reference to FIGS. 13 to 20, if the original data have a data stream of '10000000', the scrambler 211-1 may generate the scrambled data SD<0:7> having a data stream of '10101110'. While all of the second to eighth bit data continuously arrayed in the original data D<0:7> have the same logic level (i.e., a datum "0"), only the fifth to seventh bits included in the scrambled data SD<0:7> corresponding to randomized data of the original data D<0:7> are continuously arrayed to have the same logic level (i.e., a datum "1"). Thus, the probability that noise errors of the scrambled data SD<0:7> occur may be lower than the probability that noise errors of the original data D<0:7> occur.

Figure 21:
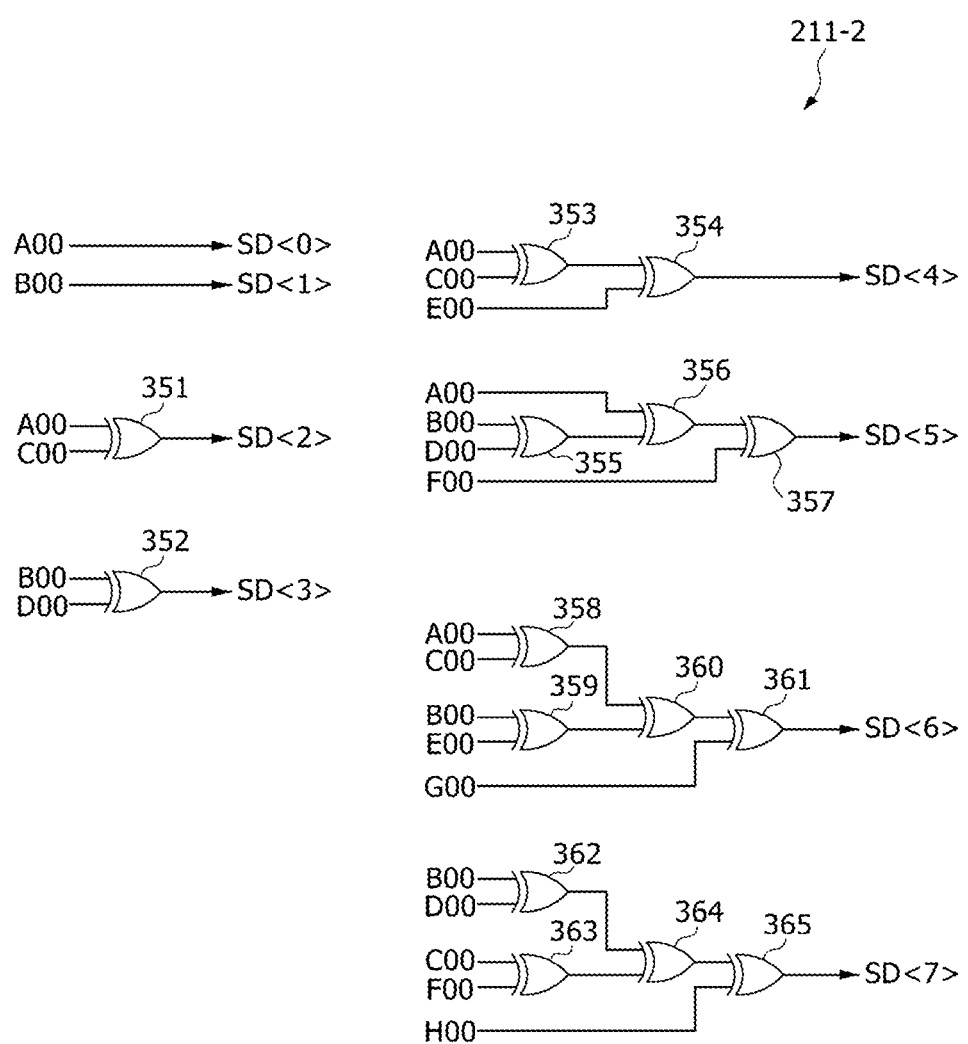
FIG. 21 is a circuit diagram illustrating another example of a scrambler included in the scrambling/ECC encoding circuit of FIG. 2.

FIG. 21 is a circuit diagram illustrating another example of the scrambler 211 included in the scrambling/ECC encoding circuit 210-1 of FIG. 2. A scrambler 211-2 corresponding to another example of the scrambler 211 may also be equally applied to the scramblers 211 of FIGS. 4 and 6 as well as the first and second scramblers 211A and 211B of FIGS. 8 and 10. Referring to FIG. 21, the scrambler 211-2 may be configured to include a plurality of XOR arithmetic elements, for example, fifteen XOR arithmetic elements 351-365. In the present embodiment, the scrambler 211-2 may be designed to include the first to fifteenth XOR arithmetic elements 351-365 because the fifteen XOR arithmetic elements 351-365 are required to realize the scrambler 211-2 if the original data have eight bits. Thus, in some embodiments, the number of the XOR arithmetic elements constituting the scrambler 211-2 may be less or greater than fifteen if the number of bits included in the original data is less or greater than eight. The scrambler 211-2 may receive in parallel all of bit data of the original data to randomly change an array sequence of the bits included in the original data and may output the randomized data as scrambled data in parallel, regardless of the number of bits included in the original data. That is, a scrambling operation for generating the scrambled data from the original data may be performed during a single cycle of a clock signal.

If the original data have eighth bits, the first to eighth bit data of the original data may be expressed as arbitrary variables of "A00", "B00", "C00", "D00", "E00", "F00", "G00" and "H00", respectively. For example, if the original data have a data stream of '10000000', data "1", "0", "0", "0", "0", "0", "0" and "0" may be respectively allocated to the arbitrary variables "A00", "B00", "C00", "D00", "E00", "F00", "G00" and "H00" of the original data during the scrambling operation. The first bit datum SD<0> of the scrambled data outputted from the scrambler 211-2 may have the same value as the arbitrary variable "A00". That is, the arbitrary variable "A00" corresponding to the first bit datum of the original data may be directly outputted as the first bit datum SD<0> of the scrambled data. The second bit datum SD<1> of the scrambled data outputted from the scrambler 211-2 may have the same value as the arbitrary variable "B00". That is, the arbitrary variable "B00" corresponding to the second bit datum of the original data may be directly outputted as the second bit datum SD<1> of the scrambled data.

The first XOR arithmetic element 351 may generate the third bit datum SD<2> of the scrambled data. The first XOR arithmetic element 351 may receive the arbitrary variable "A00" corresponding to the first bit datum of the original data and the arbitrary variable "C00" corresponding to the third bit datum of the original data and may perform an XOR operation of the arbitrary variable "A00" and the arbitrary variable "C00" to output the result of the XOR operation as the third bit datum SD<2> of the scrambled data. The second XOR arithmetic element 352 may generate the fourth bit datum SD<3> of the scrambled data. The second XOR arithmetic element 352 may receive the arbitrary variable "B00" corresponding to the second bit datum of the original data and the arbitrary variable "D00" corresponding to the fourth bit datum of the original data and may perform an XOR operation of the arbitrary variable "B00" and the arbitrary variable "D00" to output the result of the XOR operation as the fourth bit datum SD<3> of the scrambled data. The third and fourth XOR arithmetic elements 353 and 354 may generate the fifth bit datum SD<4> of the scrambled data. The third XOR arithmetic element 353 may receive the arbitrary variable "A00" corresponding to the first bit datum of the original data and the arbitrary variable "C00" corresponding to the third bit datum of the original data and may perform an XOR operation of the arbitrary variable "A00" and the arbitrary variable "C00" to output the result of the XOR operation to the fourth XOR arithmetic element 354. The fourth XOR arithmetic element 354 may receive an output datum of the third XOR arithmetic element 353 and the arbitrary variable "E00" corresponding to the fifth bit datum of the original data and may perform an XOR operation of the output datum of the third XOR arithmetic element 353 and the arbitrary variable "E00" to output the result of the XOR operation as the fifth bit datum SD<4> of the scrambled data.

The fifth, sixth and seventh XOR arithmetic elements 355, 356 and 357 may generate the sixth bit datum SD<5> of the scrambled data. The fifth XOR arithmetic element 355 may receive the arbitrary variable "B00" corresponding to the second bit datum of the original data and the arbitrary variable "D00" corresponding to the fourth bit datum of the original data and may perform an XOR operation of the arbitrary variable "B00" and the arbitrary variable "D00" to output the result of the XOR operation to the sixth XOR arithmetic element 356. The sixth XOR arithmetic element 356 may receive an output datum of the fifth XOR arithmetic element 355 and the arbitrary variable "A00" corresponding to the first bit datum of the original data and may perform an XOR operation of the output datum of the fifth XOR arithmetic element 355 and the arbitrary variable "A00" to output the result of the XOR operation to the seventh XOR arithmetic element 357. The seventh XOR arithmetic element 357 may receive an output datum of the sixth XOR arithmetic element 356 and the arbitrary variable "F00" corresponding to the sixth bit datum of the original data and may perform an XOR operation of the output datum of the sixth XOR arithmetic element 356 and the arbitrary variable "F00" to output the result of the XOR operation as the sixth bit datum SD<5> of the scrambled data.

The eighth, ninth, tenth and eleventh XOR arithmetic elements 358, 359, 360 and 361 may generate the seventh bit datum SD<6> of the scrambled data. The eighth XOR arithmetic element 358 may receive the arbitrary variable "A00" corresponding to the first bit datum of the original data and the arbitrary variable "C00" corresponding to the third bit datum of the original data and may perform an XOR operation of the arbitrary variable "A00" and the arbitrary variable "C00" to output the result of the XOR operation to the tenth XOR arithmetic element 360. The ninth XOR arithmetic element 359 may receive the arbitrary variable "B00" corresponding to the second bit datum of the original data and the arbitrary variable "E00" corresponding to the fifth bit datum of the original data and may perform an XOR operation of the arbitrary variable "B00" and the arbitrary variable "E00" to output the result of the XOR operation to the tenth XOR arithmetic element 360. The tenth XOR arithmetic element 360 may perform an XOR operation of an output datum of the eighth XOR arithmetic element 358 and an output datum of the ninth XOR arithmetic element 359 to output the result of the XOR operation to the eleventh XOR arithmetic element 361. The eleventh XOR arithmetic element 361 may receive an output datum of the tenth XOR arithmetic element 360 and the arbitrary variable "G00" corresponding to the seventh bit datum of the original data and may perform an XOR operation of the output datum of the tenth XOR arithmetic element 360 and the arbitrary variable "G00" to output the result of the XOR operation as the seventh bit datum SD<6> of the scrambled data.

The twelfth, thirteenth, fourteenth and fifteenth XOR arithmetic elements 362, 363, 364 and 365 may generate the eighth bit datum SD<7> of the scrambled data. The twelfth XOR arithmetic element 362 may receive the arbitrary variable "B00" corresponding to the second bit datum of the original data and the arbitrary variable "D00" corresponding to the fourth bit datum of the original data and may perform an XOR operation of the arbitrary variable "B00" and the arbitrary variable "D00" to output the result of the XOR operation to the fourteenth XOR arithmetic element 364. The thirteenth XOR arithmetic element 363 may receive the arbitrary variable "C00" corresponding to the third bit datum of the original data and the arbitrary variable "F00" corresponding to the sixth bit datum of the original data and may perform an XOR operation of the arbitrary variable "C00" and the arbitrary variable "F00" to output the result of the XOR operation to the fourteenth XOR arithmetic element 364. The fourteenth XOR arithmetic element 364 may perform an XOR operation of an output datum of the twelfth XOR arithmetic element 362 and an output datum of the thirteenth XOR arithmetic element 363 to output the result of the XOR operation to the fifteenth XOR arithmetic element 365. The fifteenth XOR arithmetic element 365 may receive an output datum of the fourteenth XOR arithmetic element 364 and the arbitrary variable "H00" corresponding to the eighth bit datum of the original data and may perform an XOR operation of the output datum of the fourteenth XOR arithmetic element 364 and the arbitrary variable "H00" to output the result of the XOR operation as the eighth bit datum SD<7> of the scrambled data.

In the scrambler 211-2, all of the first, third and eighth XOR arithmetic elements 351, 353 and 358 perform the same XOR operation. That is, each of the first, third and eighth XOR arithmetic elements 351, 353 and 358 performs an XOR operation that employs the arbitrary variables "A00" and "C00" as two input data. Thus, if an output terminal of the first XOR arithmetic element 351 is directly connected to an input terminal of the fourth XOR arithmetic element 354 and an input terminal of the tenth XOR arithmetic element 360 with removal of the third and eighth XOR arithmetic elements 353 and 358, the number of the XOR arithmetic elements constituting the scrambler 211-2 may be reduced without change of function of the scrambler 211-2. Similarly, all of the second, fifth and twelfth XOR arithmetic elements 352, 355 and 362 perform the same XOR operation. That is, each of the second, fifth and twelfth XOR arithmetic elements 352, 355 and 362 performs an XOR operation that employs the arbitrary variables "B00" and "D00" as two input data. Thus, if an output terminal of the second XOR arithmetic element 352 is directly connected to an input terminal of the sixth XOR arithmetic element 356 and an input terminal of the fourteenth XOR arithmetic element 364 with removal of the fifth and twelfth XOR arithmetic elements 355 and 362, the number of the XOR arithmetic elements constituting the scrambler 211-2 may be additionally reduced without change of function of the scrambler 211-2.

In an embodiment, if the original data have a data stream of '10000000', data "1", "0", "0", "0", "0", "0", "0" and "0" may be respectively allocated to the arbitrary variables "A00", "B00", "C00", "D00", "E00", "F00", "G00" and "H00" of the original data. In such a case, the scrambled data SD<0:7> generated by the scrambler 211-2 may have a data stream of '10101110'. As a result, the scrambled data SD<0:7> generated by the scrambler 211-2 may have the same data stream as the scrambled data SD<0:7> generated by the scrambler 211-1 described with reference to FIGS. 12 to 20. However, while the scrambler 211-1 generates the scrambled data SD<0:7> using iterative logical operations during several cycles of a clock signal, the scrambler 211-2 may generate the scrambled data SD<0:7> during a single cycle of the clock signal without using iterative logical operations.

FIGS. 22 to 31 are tables illustrating a process for deducing XOR arithmetic equations used in realization of a logic circuit of the scrambler 211-2 illustrated in FIG. 21. In the embodiment illustrated in FIGS. 22 to 31, it is assumed that the original data inputted to the scrambler 211-2 have eight bits. Referring to FIG. 22, arbitrary variables may be allocated to bits included in the original data D<0:7>, respectively. For example, arbitrary variables "A00", "B00", "C00", "D00", "E00", "F00", "G00" and "H00" may be allocated to first to eighth bits included in the original data D<0:7>, respectively. In an embodiment, if the original data D<0:7> have a data stream of '10000000', data "1", "0", "0", "0", "0", "0", "0" and "0" may be respectively allocated to the arbitrary variables "A00", "B00", "C00", "D00", "E00", "F00", "G00" and "H00" of the original data. That is, the first to eighth bits D<0>, D<1>, D<2>, D<3>, D<4>, D<5>, D<6> and D<7> of the original data D<0:7> may have the data "1", "0", "0", "0", "0", "0", "0" and "0", respectively. Subsequently, an XOR operation may be iteratively performed using a specific logic circuit to deduce XOR arithmetic equations for expressing the bit data of the scrambled data SD<0:7> as only the arbitrary variables. In an embodiment, the specific logic circuit may have the same logic configuration as the scrambler 211-1 described with reference to FIG. 12. A process for deducing the XOR arithmetic equations will be described hereinafter with reference to FIGS. 12 and 23 to 31.

First, as illustrated in FIG. 23, the LFSR 310 may be reset to store a datum "0" into all of the storage elements S1~S5 of the LFSR 310 at an initial state. Next, as illustrated in FIG. 24, a first iteration step may be executed. At the first iteration step, the arbitrary variable "A00" corresponding to the first bit datum D<0> of the original data and an output datum "X00" of the first XOR arithmetic element 321 may be inputted to the second XOR arithmetic element 322. At the first iteration step, the output datum "X00" of the first XOR arithmetic element 321 may have a datum "0" which is generated by an XOR operation of a datum "0" stored in the second storage element S2 and a datum "0" stored in the fifth storage element S5. The second XOR arithmetic element 322 may output the arbitrary variable "A00" which is generated by an XOR operation of the datum "0" corresponding to the output datum "X00" of the first XOR arithmetic element 321 and the arbitrary variable "A00" corresponding to the first bit datum D<0> of the original data. The arbitrary variable "A00" outputted from the second XOR arithmetic element 322 may be used as the first bit datum SD<0> of the scrambled data outputted from the scrambler 211-1 and may be fed back to and stored into the first storage element S1 of the LFSR 310.

Next, as illustrated in FIG. 25, a second iteration step may be executed. At the second iteration step, the arbitrary variable "B00" corresponding to the second bit datum D<1> of the original data and an output datum "X00" of the first XOR arithmetic element 321 may be inputted to the second XOR arithmetic element 322. At the second iteration step, the output datum "X00" of the first XOR arithmetic element 321 may have a datum "0" which is generated by an XOR operation of a datum "0" stored in the second storage element S2 and a datum "0" stored in the fifth storage element S5. The second XOR arithmetic element 322 may output the arbitrary variable "B00" which is generated by an XOR operation of the datum "0" corresponding to the output datum "X00" of the first XOR arithmetic element 321 and the arbitrary variable "B00" corresponding to the second bit datum D<1> of the original data. The arbitrary variable "B00" outputted from the second XOR arithmetic element 322 may be used as the second bit datum SD<1> of the scrambled data outputted from the scrambler 211-1 and may be fed back to and stored into the first storage element S1 of the LFSR 310. In such a case, the arbitrary variable "A00" stored in the first storage element S1 of the LFSR 310 at the previous step may be shifted to and stored into the second storage element S2.

Next, as illustrated in FIG. 26, a third iteration step may be executed. At the third iteration step, the arbitrary variable "C00" corresponding to the third bit datum D<2> of the original data and an output datum "X00" of the first XOR arithmetic element 321 may be inputted to the second XOR arithmetic element 322. At the third iteration step, the output datum "X00" of the first XOR arithmetic element 321 may have the arbitrary variable "A00" which is generated by an XOR operation of the arbitrary variable "A00" stored in the second storage element S2 and a datum "0" stored in the fifth storage element S5. The second XOR arithmetic element 322 may output a datum of "A00(XOR)C00" which is generated by an XOR operation of the arbitrary variable "A00" corresponding to the output datum "X00" of the first XOR arithmetic element 321 and the arbitrary variable "C00" corresponding to the third bit datum D<2> of the original data. The datum of "A00(XOR)C00" outputted from the second XOR arithmetic element 322 may be used as the third bit datum SD<2> of the scrambled data outputted from the scrambler 211-1 and may be fed back to and stored into the first storage element S1 of the LFSR 310. In such a case, the arbitrary variable "B00" stored in the first storage element S1 of the LFSR 310 at the previous step may be shifted to and stored into the second storage element S2, and the arbitrary variable "A00" stored in the second storage element S2 of the LFSR 310 at the previous step may be shifted to and stored into the third storage element S3.

Next, as illustrated in FIG. 27, a fourth iteration step may be executed. At the fourth iteration step, the arbitrary variable "D00" corresponding to the fourth bit datum D<3> of the original data and an output datum "X00" of the first XOR arithmetic element 321 may be inputted to the second XOR arithmetic element 322. At the fourth iteration step, the output datum "X00" of the first XOR arithmetic element 321 may have the arbitrary variable "B00" which is generated by an XOR operation of the arbitrary variable "B00" stored in the second storage element S2 and a datum "0" stored in the fifth storage element S5. The second XOR arithmetic element 322 may output a datum of "B00(XOR)D00" which is generated by an XOR operation of the arbitrary variable "B00" corresponding to the output datum "X00" of the first XOR arithmetic element 321 and the arbitrary variable "D00" corresponding to the fourth bit datum D<3> of the original data. The datum of "B00(XOR)D00" outputted from the second XOR arithmetic element 322 may be used as the fourth bit datum SD<3> of the scrambled data outputted from the scrambler 211-1 and may be fed back to and stored into the first storage element S1 of the LFSR 310. In such a case, the datum "A00(XOR)C00" stored in the first storage element S1 of the LFSR 310 at the previous step may be shifted to and stored into the second storage element S2, the arbitrary variable "B00" stored in the second storage element S2 of the LFSR 310 at the previous step may be shifted to and stored into the third storage element S3, and the arbitrary variable "A00" stored in the third storage element S3 of the LFSR 310 at the previous step may be shifted to and stored into the fourth storage element S4.

Next, as illustrated in FIG. 28, a fifth iteration step may be executed. At the fifth iteration step, the arbitrary variable "E00" corresponding to the fifth bit datum D<4> of the original data and an output datum "X00" of the first XOR arithmetic element 321 may be inputted to the second XOR arithmetic element 322. At the fifth iteration step, the output datum "X00" of the first XOR arithmetic element 321 may have a datum "A00(XOR)C00" which is generated by an XOR operation of the datum "A00(XOR)C00" stored in the second storage element S2 and a datum "0" stored in the fifth storage element S5. The second XOR arithmetic element 322 may output a datum of "A00(XOR)C00(XOR)B00" which is generated by an XOR operation of the datum "A00(XOR)C00" corresponding to the output datum "X00" of the first XOR arithmetic element 321 and the arbitrary variable "E00" corresponding to the fifth bit datum D<4> of the original data. The datum of "A00(XOR)C00(XOR)B00"

outputted from the second XOR arithmetic element 322 may be used as the fifth bit datum SD<4> of the scrambled data outputted from the scrambler 211-1 and may be fed back to and stored into the first storage element S1 of the LFSR 310. In such a case, the datum "B00(XOR)D00" stored in the first storage element S1 of the LFSR 310 at the previous step may be shifted to and stored into the second storage element S2, the datum "A00(XOR)C00" stored in the second storage element S2 of the LFSR 310 at the previous step may be shifted to and stored into the third storage element S3, the arbitrary variable "B00" stored in the third storage element S3 of the LFSR 310 at the previous step may be shifted to and stored into the fourth storage element S4, and the arbitrary variable "A00" stored in the fourth storage element S4 of the LFSR 310 at the previous step may be shifted to and stored into the fifth storage element S5.

Next, as illustrated in FIG. 29, a sixth iteration step may be executed. At the sixth iteration step, the arbitrary variable "F00" corresponding to the sixth bit datum D<5> of the original data and an output datum "X00" of the first XOR arithmetic element 321 may be inputted to the second XOR arithmetic element 322. At the sixth iteration step, the output datum "X00" of the first XOR arithmetic element 321 may have a datum "A00(XOR)B00(XOR)D00" which is generated by an XOR operation of the datum "B00(XOR)D00" stored in the second storage element S2 and the arbitrary variable "A00" stored in the fifth storage element S5. The second XOR arithmetic element 322 may output a datum of "A00(XOR)B00(XOR)D00(XOR)F00" which is generated by an XOR operation of the datum "A00(XOR)B00(XOR)D00" corresponding to the output datum "X00" of the first XOR arithmetic element 321 and the arbitrary variable "F00" corresponding to the sixth bit datum D<5> of the original data. The datum of "A00(XOR)B00(XOR)D00(XOR)F00" outputted from the second XOR arithmetic element 322 may be used as the sixth bit datum SD<5> of the scrambled data outputted from the scrambler 211-1 and may be fed back to and stored into the first storage element S1 of the LFSR 310. In such a case, the datum "A00(XOR)C00(XOR)E00" stored in the first storage element S1 of the LFSR 310 at the previous step may be shifted to and stored into the second storage element S2, the datum "B00(XOR)D00" stored in the second storage element S2 of the LFSR 310 at the previous step may be shifted to and stored into the third storage element S3, the datum "A00(XOR)C00" stored in the third storage element S3 of the LFSR 310 at the previous step may be shifted to and stored into the fourth storage element S4, and the arbitrary variable "B00" stored in the fourth storage element S4 of the LFSR 310 at the previous step may be shifted to and stored into the fifth storage element S5.

Next, as illustrated in FIG. 30, a seventh iteration step may be executed. At the seventh iteration step, the arbitrary variable "G00" corresponding to the seventh bit datum D<6> of the original data and an output datum "X00" of the first XOR arithmetic element 321 may be inputted to the second XOR arithmetic element 322. At the seventh iteration step, the output datum "X00" of the first XOR arithmetic element 321 may have a datum "A00(XOR)B00(XOR)C00(XOR)E00" which is generated by an XOR operation of the datum "A00(XOR)C00(XOR)E00" stored in the second storage element S2 and the arbitrary variable "B00" stored in the fifth storage element S5. The second XOR arithmetic element 322 may output a datum of "A00(XOR)B00(XOR)C00(XOR)E00(XOR)G00" which is generated by an XOR operation of the datum "A00(XOR)B00(XOR)C00(XOR)E00" corresponding to the output datum "X00" of the first XOR arithmetic element 321 and the arbitrary variable "G00" corresponding to the seventh bit datum D<6> of the original data. The datum of "A00(XOR)B00(XOR)C00(XOR)E00(XOR)G00" outputted from the second XOR arithmetic element 322 may be used as the seventh bit datum SD<6> of the scrambled data outputted from the scrambler 211-1 and may be fed back to and stored into the first storage element S1 of the LFSR 310. In such a case, the datum "A00(XOR)B00(XOR)D00(XOR)F00" stored in the first storage element S1 of the LFSR 310 at the previous step may be shifted to and stored into the second storage element S2, the datum "A00(XOR)C00(XOR)E00" stored in the second storage element S2 of the LFSR 310 at the previous step may be shifted to and stored into the third storage element S3, the datum "B00(XOR)D00" stored in the third storage element S3 of the LFSR 310 at the previous step may be shifted to and stored into the fourth storage element S4, and the datum "A00(XOR)C00" stored in the fourth storage element S4 of the LFSR 310 at the previous step may be shifted to and stored into the fifth storage element S5.

Next, as illustrated in FIG. 31, an eighth iteration step may be executed. At the eighth iteration step, the arbitrary variable "H00" corresponding to the eight bit datum D<7> of the original data and an output datum "X00" of the first XOR arithmetic element 321 may be inputted to the second XOR arithmetic element 322. At the eighth iteration step, the output datum "X00" of the first XOR arithmetic element 321 may have a datum "B00(XOR)C00(XOR)D00(XOR)F00" which is generated by an XOR operation of the datum "A00(XOR)B00(XOR)D00(XOR)F00" stored in the second storage element S2 and the datum "A00(XOR)C00" stored in the fifth storage element S5. The second XOR arithmetic element 322 may output a datum of "B00(XOR)C00(XOR)D00(XOR)F00(XOR)H00" which is generated by an XOR operation of the datum "B00(XOR)C00(XOR)D00(XOR)F00" corresponding to the output datum "X00" of the first XOR arithmetic element 321 and the arbitrary variable "H00" corresponding to the eighth bit datum D<7> of the original data. The datum of "B00(XOR)C00(XOR)D00(XOR)F00(XOR)H00" outputted from the second XOR arithmetic element 322 may be used as the eighth bit datum SD<7> of the scrambled data outputted from the scrambler 211-1.

As described with reference to FIGS. 22 to 31, each bit datum of the scrambled data SD<0:7> outputted from the scrambler 211-1 by scrambling the original data D<0:7> may be expressed by an XOR arithmetic equation corresponding to a function of the arbitrary variables. That is, the first bit datum SD<0> of the scrambled data may be the arbitrary variable "A00", the second bit datum SD<1> of the scrambled data may be the arbitrary variable "B00", the third bit datum SD<2> of the scrambled data may be expressed by an XOR arithmetic equation of "A00(XOR)C00", the fourth bit datum SD<3> of the scrambled data may be expressed by an XOR arithmetic equation of "B00(XOR)D00", the fifth bit datum SD<4> of the scrambled data may be expressed by an XOR arithmetic equation of "A00(XOR)C00(XOR)E00", the sixth bit datum SD<5> of the scrambled data may be expressed by an XOR arithmetic equation of "A00(XOR)B00(XOR)D00(XOR)F00", the seventh bit datum SD<6> of the scrambled data may be expressed by an XOR arithmetic equation of "A00(XOR)B00(XOR)C00(XOR)E00(XOR)G00", and the eighth bit datum SD<7> of the scrambled data may be expressed by an XOR arithmetic equation of "B00(XOR)C00(XOR)D00(XOR)F00(XOR)H00". Thus, if a logic circuit is realized using a plurality of XOR arithmetic elements based on the above XOR arithmetic equations, the logic circuit may have the same configuration as the scrambler 211-2 illustrated in FIG. 21 and may process the original data in parallel.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An error correction apparatus comprising:
a scrambler configured to randomize original data to generate scrambled data;
an error correction code (ECC) encoder configured to perform an ECC encoding operation of the scrambled data to generate encoded data to be outputted from the error correction apparatus;
an ECC decoder configured to perform an ECC decoding operation of the encoded data, which are received by the error correction apparatus externally from the error correction apparatus, to generate decoded data corresponding to corrected data of the encoded data;
a descrambler configured to descramble the decoded data having a bit array sequence randomized by the scrambler to generate descrambled data that are restored to have the same bit array sequence as the original data;
a scrambling discriminator configured to discriminate whether the original data have to be scrambled to supply the original data to the scrambler or the ECC encoder; and
a descrambling discriminator configured to discriminate whether the encoded data is the scrambled data or the original data to output the decoded data to the descrambler or an external device out of the error correction apparatus.

2. The error correction apparatus of claim 1, wherein the encoded data are generated to include parity data in addition to the original data.

3. The error correction apparatus of claim 1, wherein the scrambler includes:
a shift register configured to have a plurality of storage elements;
a first exclusive OR (XOR) arithmetic element configured to perform an XOR operation of data stored in two storage elements among the plurality of storage elements to output the result of the XOR operation; and
a second XOR arithmetic element configured to perform an XOR operation of an output datum of the first XOR arithmetic element and one datum among a plurality of bit data of the original data to output the result of the XOR operation,
wherein the plurality of bit data of the original data are sequentially inputted to the second XOR arithmetic element.

4. The error correction apparatus of claim 3, wherein an output datum of the second XOR arithmetic element is fed back to and stored into a first storage element of the shift register.

5. The error correction apparatus of claim 3, wherein an output datum of the second XOR arithmetic element is used as one among a plurality of bit data constituting the scrambled data.

6. The error correction apparatus of claim 1,
wherein the scrambler is configured to include a plurality of XOR arithmetic elements; and wherein the scrambler receives the original data in parallel and performs a plurality of XOR operations using the plurality of XOR arithmetic elements to generate and output the scrambled data in parallel.

7. The error correction apparatus of claim 6, wherein the plurality of XOR arithmetic elements are disposed so that each bit datum of the scrambled data is calculated by an XOR arithmetic equation which is expressed as at least one among arbitrary variables that respectively correspond to bit data of the original data.

8. The error correction apparatus of claim 1, wherein the decoded data generated by the ECC decoder is identical to the scrambled data generated by the scrambler.

9. The error correction apparatus of claim 1, wherein the corrected data of the encoded data is attributable to soft errors of the memory device rather than errors due to a noise effect.

10. An error correction apparatus comprising:
a scrambler configured to randomize original data to generate scrambled data;
a randomness checker configured to compare randomness of the original data with randomness of the scrambled data to generate a first control selection signal;
a scrambling selector configured to select and output the original data or the scrambled data based on the first control selection signal;
an error correction code (ECC) encoder configured to perform an ECC encoding operation of output data of the scrambling selector to generate encoded data to be outputted from the error correction apparatus;
an ECC decoder configured to perform an ECC decoding operation of the encoded data, which are received by the error correction apparatus externally from the error correction apparatus, to generate decoded data corresponding to corrected data of the encoded data;
a descrambling selector configured to output the decoded data to a first route or a second route based on a second control selection signal; and
a descrambler configured to descramble the decoded data to generate descrambled data that are restored to have the same bit array sequence as the original data if the descrambling selector outputs the decoded data to the first route.

11. The error correction apparatus of claim 10, wherein the second route directly connects the descrambling selector to an external device disposed at an outside region of the error correction apparatus.

12. An error correction apparatus comprising:
a first scrambler configured to firstly randomize original data to generate first scrambled data;
a second scrambler configured to secondly randomize the first scrambled data to generate second scrambled data;
an error correction code (ECC) encoder configured to perform an ECC encoding operation of the second scrambled data to generate encoded data to be written into a memory device;
an ECC decoder configured to perform an ECC decoding operation of the encoded data, which are read out from the memory device, to generate decoded data corresponding to corrected data of the encoded data;
a first descrambler configured to descramble the decoded data having a bit array sequence randomized by the second scrambler to generate first descrambled data that are restored to have the same bit array sequence as the first scrambled data;
a second descrambler configured to descramble the first descrambled data having a bit array sequence randomized by the first scrambler to generate second descrambled data that are restored to have the same bit array sequence as the original data;

a randomness checker configured to analyze randomness of the original data, the first scrambled data and the second scrambled data to generate a first control selection signal;

a scrambling selector configured to select and output the original data, the first scrambled data or the second scrambled data based on the first control selection signal; and a descrambling selector configured to output the decoded data to one route selected from a first route, a second route and a third route based on a second control selection signal.

13. The error correction apparatus of claim 12,
wherein the third route directly connects the descrambling selector to an external device disposed at an outside region of the error correction apparatus.

* * * * *